(12) United States Patent
Fujimori et al.

(10) Patent No.: US 8,392,156 B2
(45) Date of Patent: Mar. 5, 2013

(54) POWER SUPPLY NOISE ANALYSIS MODEL CREATION METHOD AND APPARATUS, AND RECORDING MEDIUM STORING PROGRAM FOR POWER SUPPLY NOISE ANALYSIS MODEL CREATION

(75) Inventors: Shogo Fujimori, Kawasaki (JP); Koutarou Nimura, Kawasaki (JP); Tendou Hirai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 723 days.

(21) Appl. No.: 12/567,923

(22) Filed: Sep. 28, 2009

(65) Prior Publication Data

US 2010/0082304 A1  Apr. 1, 2010

(30) Foreign Application Priority Data

Sep. 29, 2008  (JP) .................... 2008-250920

(51) Int. Cl.
*G06F 7/60* (2006.01)
*G06F 17/50* (2006.01)
(52) U.S. Cl. .............. 703/2; 716/120; 716/127
(58) Field of Classification Search ............ 703/2, 18; 716/109, 120, 127
See application file for complete search history.

(56) References Cited

U.S. PATENT DOCUMENTS

| | | | |
|---|---|---|---|
| 6,617,943 B1* | 9/2003 | Fazelpour | 333/204 |
| 7,168,058 B2* | 1/2007 | Harada et al. | 716/112 |
| 7,197,446 B2* | 3/2007 | Breiland et al. | 703/14 |
| 7,823,096 B2* | 10/2010 | Katagiri et al. | 716/136 |
| 2003/0083856 A1 | 5/2003 | Yoshimura et al. | |
| 2004/0225487 A1* | 11/2004 | Iwakura et al. | 703/18 |
| 2006/0173662 A1* | 8/2006 | Kazama et al. | 703/4 |

FOREIGN PATENT DOCUMENTS

| | | |
|---|---|---|
| JP | 2002-368116 A | 12/2002 |
| JP | 2003-141205 A | 5/2003 |
| JP | 2004-334618 A | 11/2004 |
| JP | 2004-334654 A | 11/2004 |
| JP | 2006-209590 A | 8/2006 |

OTHER PUBLICATIONS

Jong-Kwan Yook et al.; "Computation of Switching Noise in Printed Circuit Boards", 1997, IEEE Transactions on Components, Packaging, and Manufacturing Technology, Part A, vol. 20, No. 1, Mar. 1997, pp. 64-75.*
Hao Shi et al.; "Modeling Multilayered PCB Power-Bus Designs Using an MPIE Based Circuit Extraction Technique", Aug. 1998, IEEE International Symposium on Electromagnetic Compatibility, pp. 647-651.*

* cited by examiner

*Primary Examiner* — Kamini S Shah
*Assistant Examiner* — Juan Ochoa
(74) *Attorney, Agent, or Firm* — Westerman, Hattori, Daniels & Adrian, LLP

(57) ABSTRACT

A power supply noise analysis model creation method comprising; obtaining a distance which appears most frequently, from among the distances from a vias judged to be the nearest to the vias, respectively, as a reference via pitch, generates four nodes for the via of target wherein the four nodes generates the middle point with the other four via that are near the via of the target, obtaining meshes which include the nodes, respectively, by dividing the power island structure and the power supply pair by dividing lines which pass between the generated nodes, and converting each of the meshes obtained to a circuit element equivalent to the mesh.

9 Claims, 30 Drawing Sheets

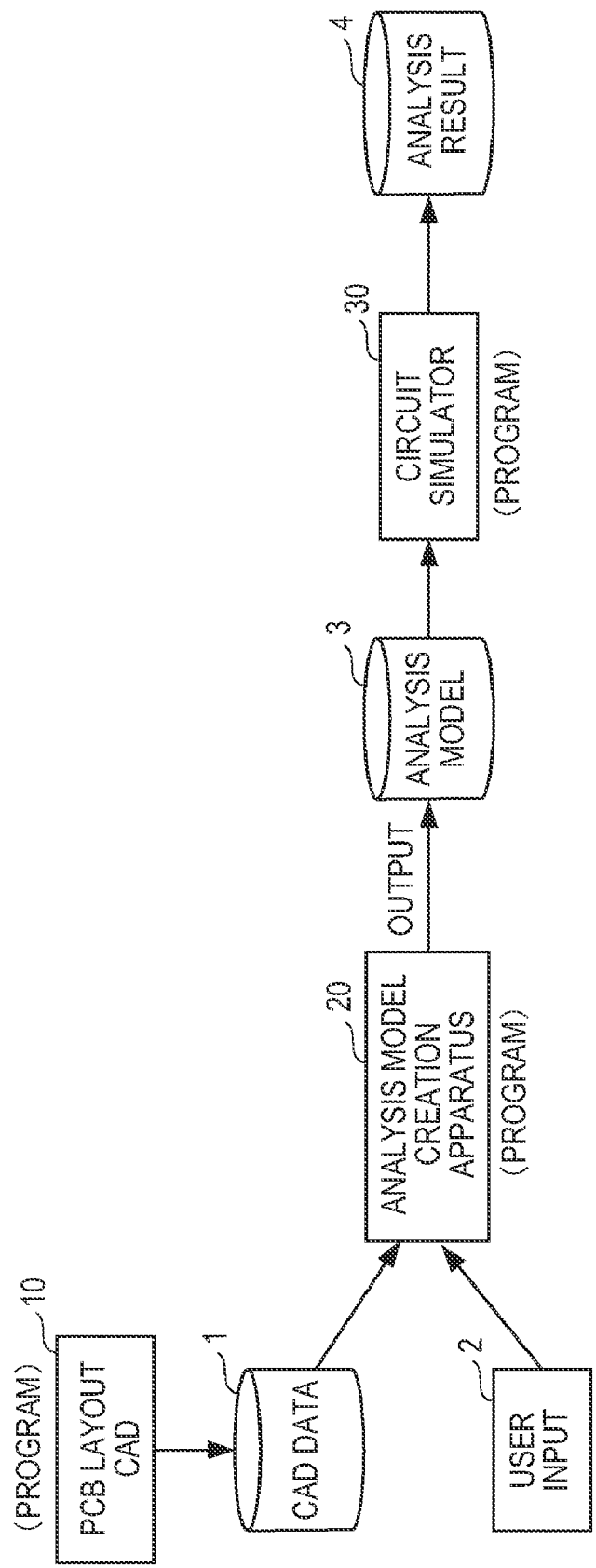

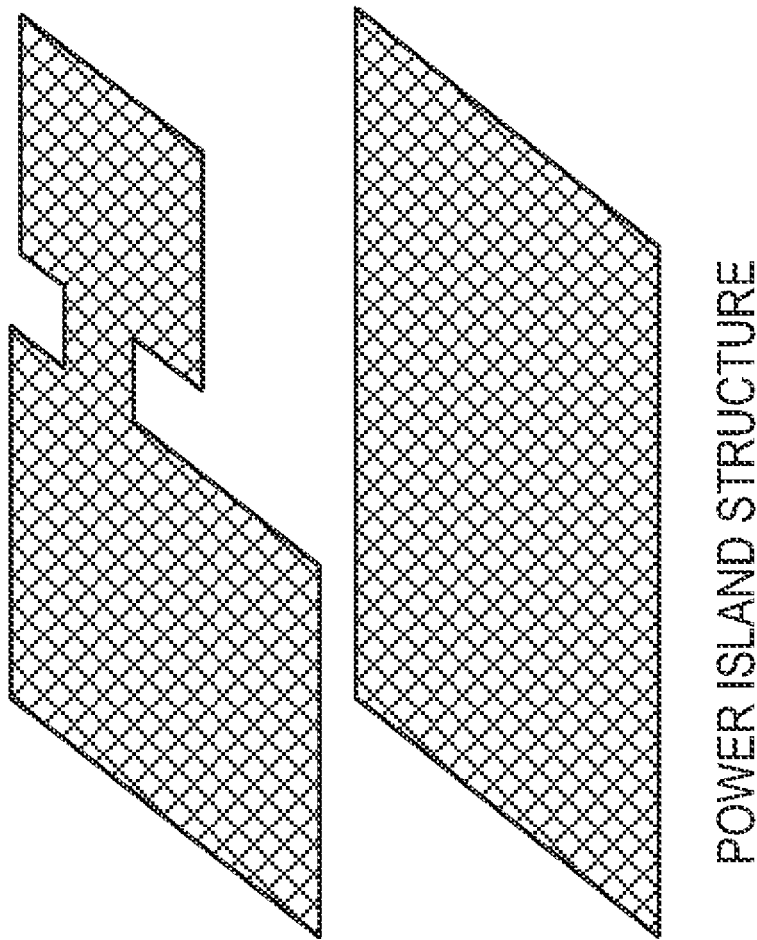

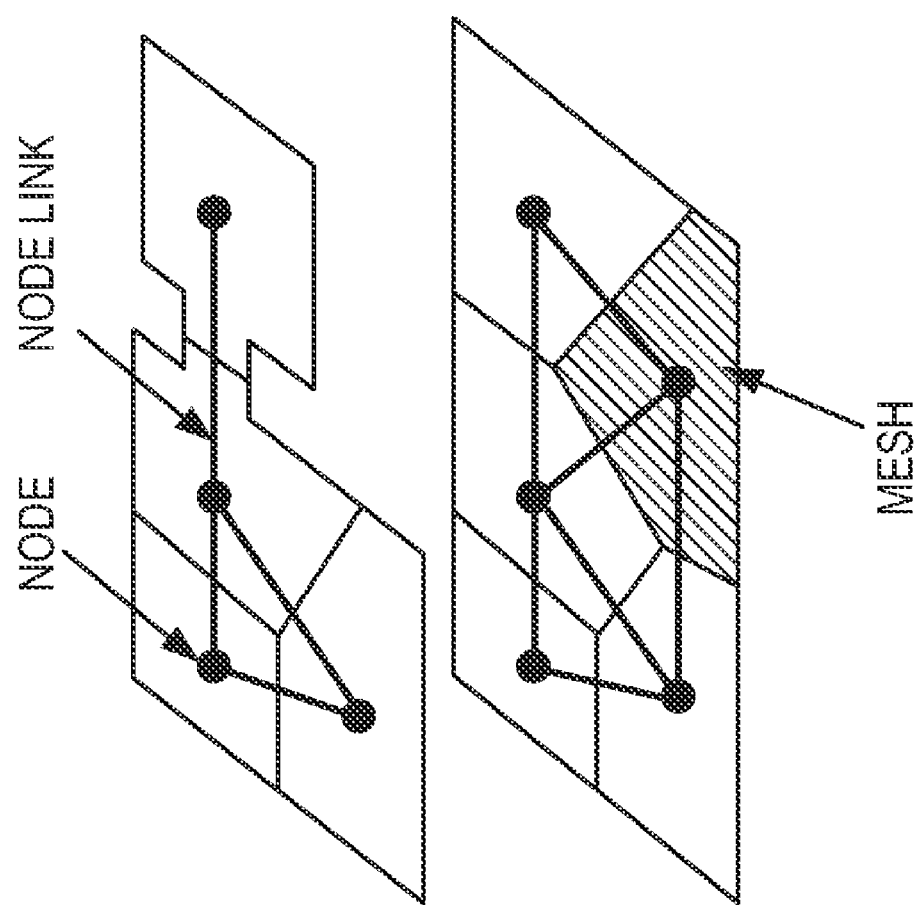

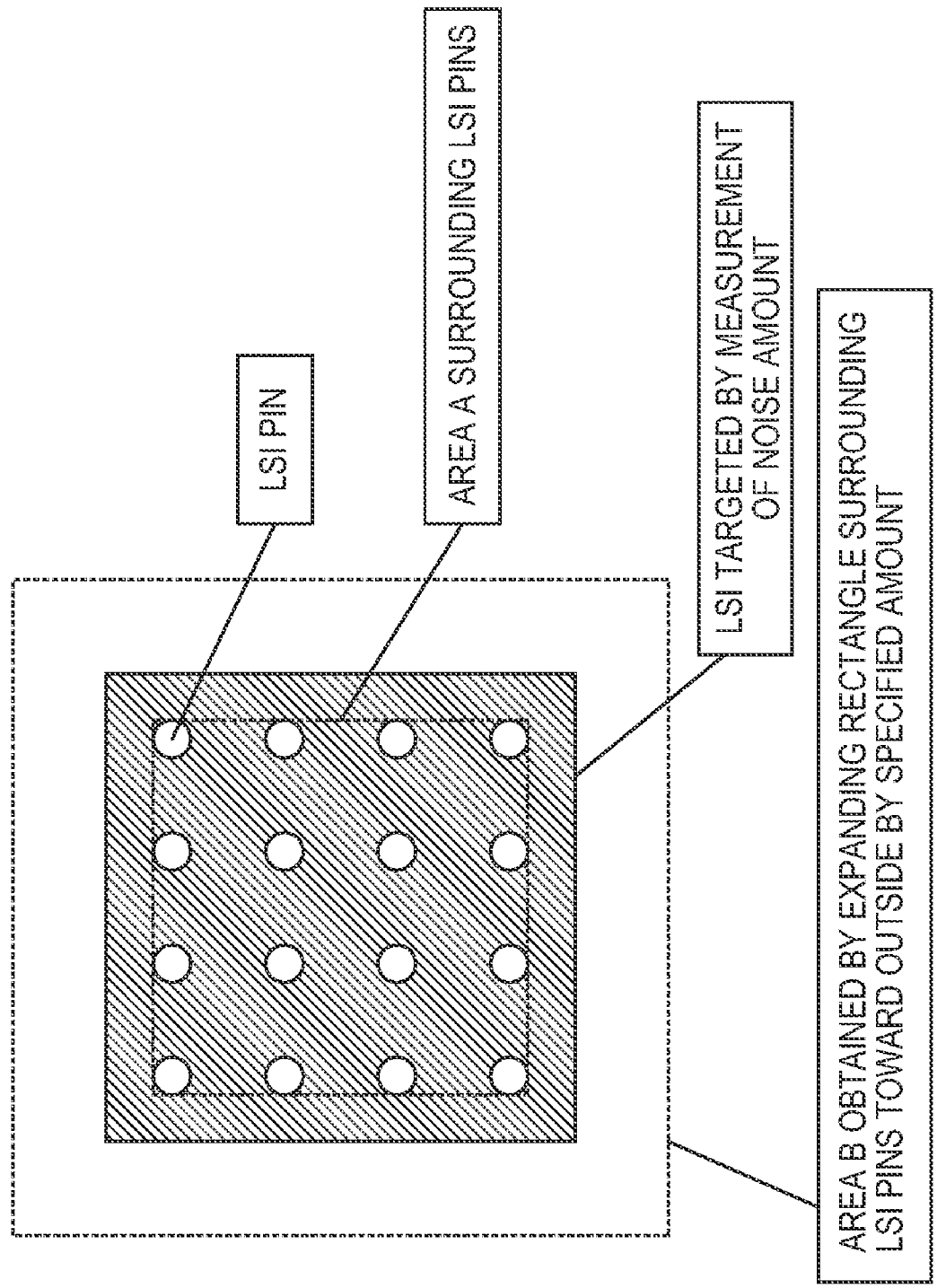

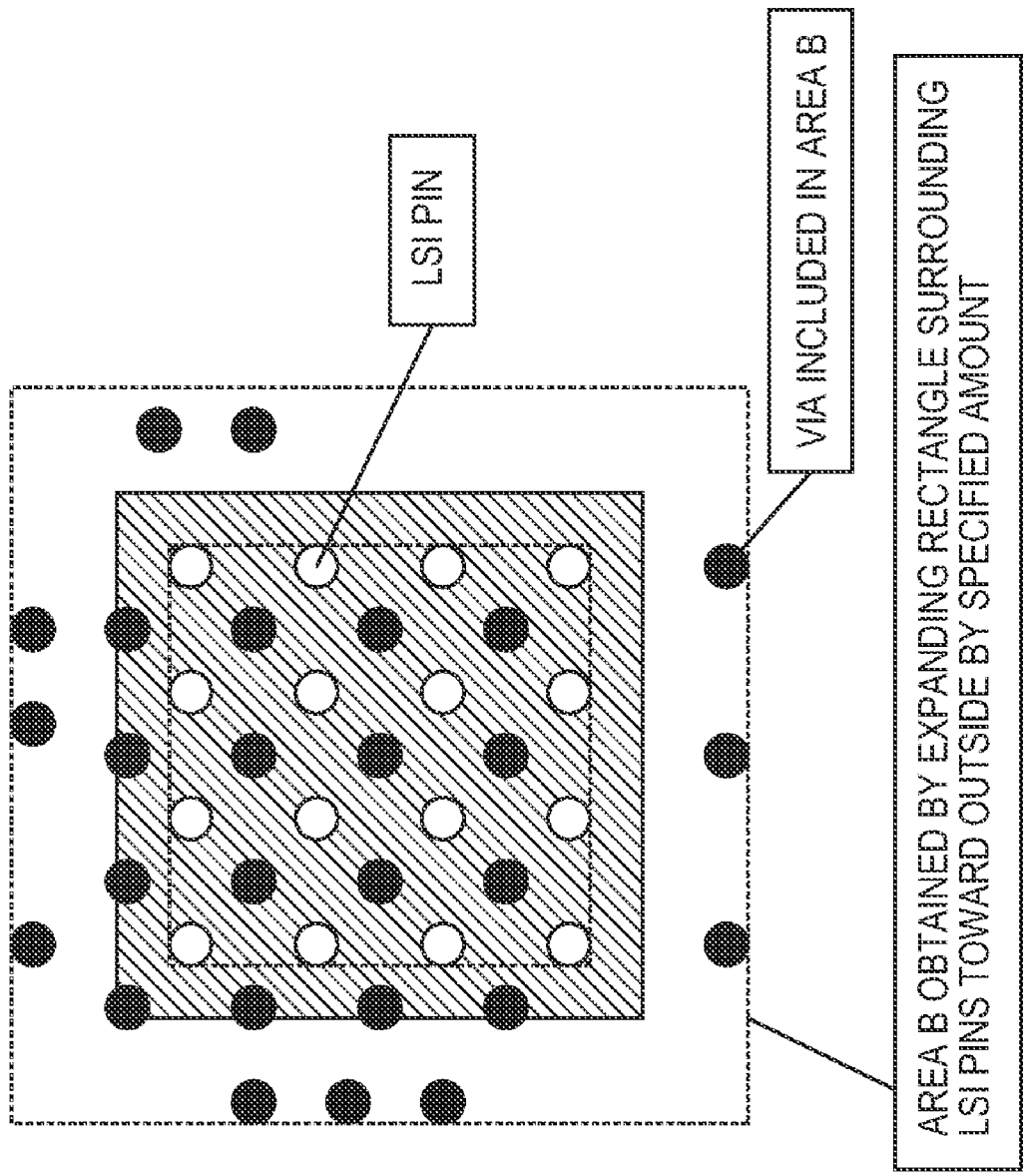

FIG. 6A (TABLE A)

| |
|---|
| VIA COORDINATES (Vx1, Vy1) |
| INFORMATION ABOUT LINK TO NEAREST VIA |
| DISTANCE FROM NEAREST VIA |
| DIRECTION OF NEAREST VIA |
| VIA COORDINATES (Vx2, Vy2) |
| VIA COORDINATES (Vx1, Vy1) |
| INFORMATION ABOUT LINK TO NEAREST VIA |
| DISTANCE FROM NEAREST VIA |
| DIRECTION OF NEAREST VIA |
| VIA COORDINATES (Vx2, Vy2) |
| . . |
| VIA COORDINATES (Vx1, Vy1) |
| INFORMATION ABOUT LINK TO NEAREST VIA |
| DISTANCE FROM NEAREST VIA |
| DIRECTION OF NEAREST VIA |
| VIA COORDINATES (Vx2, Vy2) |

FIG. 6B ( TABLE B )

| NODE COORDINATES (Nx1,Ny1) |
|---|
| NODE COORDINATES (Nx2,Ny2) |
| NODE COORDINATES (Nx1,Ny1) |
| NODE COORDINATES (Nx2,Ny2) |
| ⋮ |
| NODE COORDINATES (Nx1,Ny1) |
| NODE COORDINATES (Nx2,Ny2) |

FIG. 6C (TABLE C)

| NODE COORDINATES (Nx3,Ny3) |
| DELETION FLAG |
| NODE COORDINATES (Nx3,Ny3) |
| DELETION FLAG |
| ⋮ |
| NODE COORDINATES (Nx3,Ny3) |
| DELETION FLAG |

FIG. 6D (TABLE D)

| VIA-TO-VIA DISTANCE |
| --- |
| APPEARANCE FREQUENCY |
| VIA-TO-VIA DISTANCE |
| APPEARANCE FREQUENCY |
| VIA-TO-VIA DISTANCE |
| APPEARANCE FREQUENCY |
| . . |
| VIA-TO-VIA DISTANCE |
| APPEARANCE FREQUENCY |

FIG. 6E ( TABLE E )

| ANGLE α |
| APPEARANCE FREQUENCY |
| ANGLE α |
| APPEARANCE FREQUENCY |
| ANGLE α |
| APPEARANCE FREQUENCY |
| . . |
| ANGLE α |
| APPEARANCE FREQUENCY |

FIG. 18A

| | THE NUMBER OF ANALYSIS MODEL ELEMENTS | ANALYSIS TIME | AMOUNT OF MEMORY USED |
|---|---|---|---|
| 250 μm PITCH MESH | 277,166 | 53 MINUTES AND 36 SECONDS | 499MB |
| NODES AROUND VIAS ADDED (EMBODIMENT) | 17,850 | 3 MINUTES AND 44 SECONDS | 37MB |
| NODES AROUND VIAS ADDED AT EVERY THREE POSITIONS (EMBODIMENT) | 3,373 | 11 SECONDS | 8MB |
| WITHOUT ADDITION OF NODES AROUND VIAS | 1,397 | 1 SECOND | 5MB |

FIG. 18B

| FREQUENCY | 100MHz | 200MHz | 400MH | 600MHz | 800MHz |
|---|---|---|---|---|---|
| 250 μm PITCH MESH | 3.5 Ω | 7.83 Ω | 1.40 Ω | 0.0898 Ω | 1.68 Ω |
| NODES AROUND VIAS ADDED (EMBODIMENT) | 3.46 Ω (-1%) | 8.13 Ω (4%) | 1.46 Ω (4%) | 0.158 Ω (76%) | 1.24 Ω (22%) |
| NODES AROUND VIAS ADDED AT EVERY THREE POSITIONS (EMBODIMENT) | 3.46 Ω (-1%) | 8.01 Ω (4%) | 1.42 Ω (1%) | 0.193 Ω (115%) | 1.34 Ω (-31) |
| WITHOUT ADDITION OF NODES AROUND VIAS | 3.48 Ω (0%) | 7.61 Ω (-3%) | 1.38 Ω (-2%) | 0.225 Ω (151%) | 1.16 Ω (-46) |

POWER SUPPLY NOISE ANALYSIS MODEL CREATION METHOD AND APPARATUS, AND RECORDING MEDIUM STORING PROGRAM FOR POWER SUPPLY NOISE ANALYSIS MODEL CREATION

CROSS-REFERENCE TO RELATED APPLICATION

This application is based upon and claims the benefit of priority of the prior Japanese Patent Application No. 2008-250920, filed on Sep. 29, 2008, the entire contents of which are incorporated herein by reference.

BACKGROUND

The described embodiments relate to a power supply noise analysis model creation method, a power supply noise analysis model creation apparatus and a power supply noise analysis model creation program.

A power supply and ground layer analysis model is used to analyze power supply noise caused on a circuit board such as a PCB (Printed-Circuit Board; hereinafter the same), MCM (Multi-Chip Module) or LSI (Large Scale Integrated circuit; hereinafter the same) package.

To analyze the electrical characteristics and the circuit operation of the power supply and the ground layer of a circuit board, an analysis model is created from the design data of the circuit board, and the analysis model is solved utilizing a circuit simulator. SPICE (Simulation Program with Integrated Circuit Emphasis) is a typical circuit simulator.

In a surface mount type LSI with part pins arranged on the LSI bottom in a grid-like fashion, which is called PGA (Pin Grid Array), LGA (Land Grid Array) or BGA (Ball Grid Array), drawing vias from surface mount pads are also arranged on the grid. Therefore, on the circuit board, the power supply or the ground plane provided on an area where an LSI is to be mounted, may be provided with an area without a conductor in a manner that a passing via is surrounded by the area. Thereby avoiding a short circuit with a via in a different net. This area is referred to as a via clearance hole. It is conceivable that, if it is not possible to reflect the shape of the via clearance hole when creating the analysis model, the accuracy of an analysis result deteriorates.

(for example, Japanese Patent Laid-Open No. 2006-209590, Japanese Patent Laid-Open No. 2002-368116, Japanese Patent Laid-Open No. 2003-141205, Japanese Patent Laid-Open No. 2004-334654 and Japanese Patent Laid-Open No. 2004-334618).

SUMMARY

A method which includes reading data indicating the shapes of power supply conductors or grounding conductors of a multi-layer circuit board from a memory, and generating the data of a power island structure indicating the power supply conductors or grounding conductors provided on the circuit board on the basis of the data; reading data indicating the shapes of power supply conductors or grounding conductors provided on different layers of the multi-layer circuit board from the memory, and generating the data of a power supply pair indicating a shape where the power supply conductors or the grounding conductors provided on the different layers of the multi-layer circuit board face with each other on the basis of the data; reading the data of the positions of connection pads of a semiconductor device mounted on the circuit board from the memory, and determining a processing target area including the positions of the connection pads of the semiconductor device on the basis of the data, reading the data of the positions of vias included in the processing target area from the memory, and storing the data of the positions of the vias into the memory; reading the data of the positions of the vias from the memory, calculating the distances among the vias on the basis of the data, and judging, for each of the vias, the nearest via;

obtaining a distance which appears most frequently, from among the distances from the vias judged to be the nearest to the vias, respectively, as a reference via pitch; obtaining each of the vias the position data of which is stored in the memory, as a processing target via, and generating four nodes for the processing target via in a manner that the position relation between the processing target via and the four nodes corresponds to the position relation between one via and four nodes in the case where, when vias are two-dimensionally arrayed with the reference via pitch, a total of the four nodes are generated for the one via, each of the four nodes being generated at almost the middle point of each of line segments connecting the one via and adjacent four vias in directions oblique to the direction of the reference via pitch; obtaining meshes which include the nodes, respectively, by dividing the power island structure by dividing lines which pass between the generated nodes; obtaining meshes which include the nodes, respectively, by dividing the power supply pair by dividing lines which pass between the generated nodes; and converting each of the meshes obtained in each of the power island structure mesh dividing step and power supply pair mesh dividing step to a circuit element equivalent to the mesh and generating an analysis model for analyzing power supply noise caused on the circuit board.

The method and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 1 is a block diagram for illustrating an example of application of a power supply noise analysis model creation apparatus of an embodiment;

FIG. 2B is a perspective view (2) for illustrating the creation process of a power supply mesh model as a power supply noise analysis model;

FIG. 2C is a perspective view (3) for illustrating the creation process of a power supply mesh model as a power supply noise analysis model;

FIG. 5A is a plane view (1) for illustrating an area targeted by node addition processing in the power supply noise analysis model creation method according to the embodiment;

FIG. 5B is a plane view (2) for illustrating an area targeted by node addition processing in the power supply noise analysis model creation method according to the embodiment;

FIG. 6A is a diagram (1) for illustrating table data used for the node addition processing in the power supply noise analysis model creation method according to the embodiment;

FIG. 6B is a diagram (2) for illustrating table data used for the node addition processing in the power supply noise analysis model creation method according to the embodiment;

FIG. 6C is a diagram (3) for illustrating table data used for the node addition processing in the power supply noise analysis model creation method according to the embodiment;

FIG. 6D is a diagram (4) for illustrating table data used for the node addition processing in the power supply noise analysis model creation method according to the embodiment;

FIG. 6E is a diagram (5) for illustrating table data used for the node addition processing in the power supply noise analysis model creation method according to the embodiment;

FIG. 18A is a diagram (1) for illustrating an example of application of the embodiment;

FIG. 18B is a diagram (2) for illustrating an example of application of the embodiment.

BRIEF DESCRIPTION OF EMBODIMENT

Figure 2A:
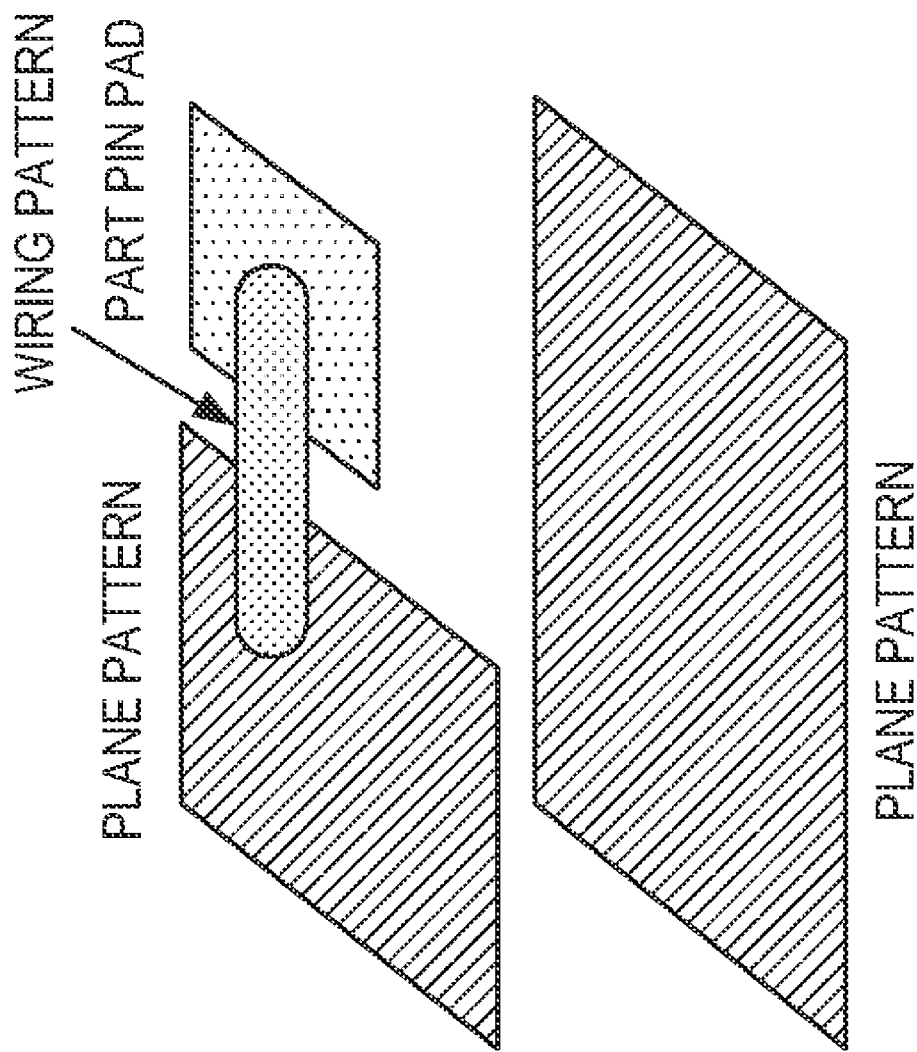
FIG. 2A is a perspective view (1) for illustrating the creation process of a power supply mesh model as a power supply noise analysis model.

FIG. 1 is a block diagram for illustrating the case of applying a power supply noise analysis model creation apparatus having a function of automatically executing a power supply noise analysis model creation method according to an embodiment.

In FIG. 1, a PCB layout designer designs a PCB layout using a PCB layout CAD 10, and the data of the designed PCB layout is stored as CAD data 1. When the PCB layout data is inputted to the analysis model creation apparatus 20, the analysis model creation apparatus 20 automatically executes the power supply noise analysis model creation method on the basis of the PCB layout data. In this way, the analysis model creation apparatus 20 creates analysis model data 3 for power supply noise analysis on the basis of the PCB layout. As described later with reference to FIGS. 16 and 17, the analysis model creation apparatus 20 can be realized by installing a power supply noise analysis model creation program in a computer and the computer executing the program. A user can input conditions for analysis model creation executed by the analysis model creation apparatus 20, as a user input 2.

The power supply noise analysis model data 3 obtained in this way is inputted to a circuit simulator 30 as described above. The circuit simulator 30 performs power supply noise analysis of the PCB layout by simulation, using the power supply noise analysis model data 3, and outputs an analysis result 4.

Here, the power supply noise analysis model is a model obtained by dividing the shape of a power supply or a ground plane into meshes and converting each mesh to an equivalent circuit such as an inductance, a capacitance and a resistance. FIGS. 2A to 2D are diagrams for illustrating the flow of power supply noise analysis model creation by the power supply noise analysis model creation method.

In FIG. 2A, the shape of a power supply conductor or a grounding conductor provided on a multi-layer circuit board is shown as a "plane pattern", "wiring pattern" or "part pin pad". In FIG. 2A, the "plane pattern" indicates a power supply conductor or a grounding conductor as a plane pattern provided on a power supply layer or a grounding layer of a multi-layer circuit board. The power conductor as a plane pattern is referred to as a power supply plane, and the grounding conductor as a plane pattern is referred to as a ground plane. In FIG. 2A, the "part pin pad" indicates a power supply conductor or a grounding conductor as a part pin pad provided at a position where a semiconductor device such as an LSI is mounted. The "wiring pattern" indicates a power conductor or a grounding conductor as a wiring pattern which electrically connects the plane pattern and the part pin pad.

FIG. 2B shows a power island structure created on the basis of the power supply conductors or the grounding conductors shown in FIG. 2A. Here, the power island structure refers to a shape formed by connecting power supply conductors for each layer of the multi-layer circuit board. In the CAD data 1, a power supply conductor or a grounding conductor is included as data indicating multiple polygons and lines. Among the multiple polygons and lines indicated by the data, a shape obtained by synthesizing those which are connected with one another is obtained as a power island structure. The power island structure includes a power island structure configured by a power supply conductor and a power island structure configured by a grounding conductor.

FIG. 2C shows a state that each of the power island structures shown in FIG. 2B are divided in meshes each of which includes one node, and that the nodes are connected with one another via node links.

Figure 2D:
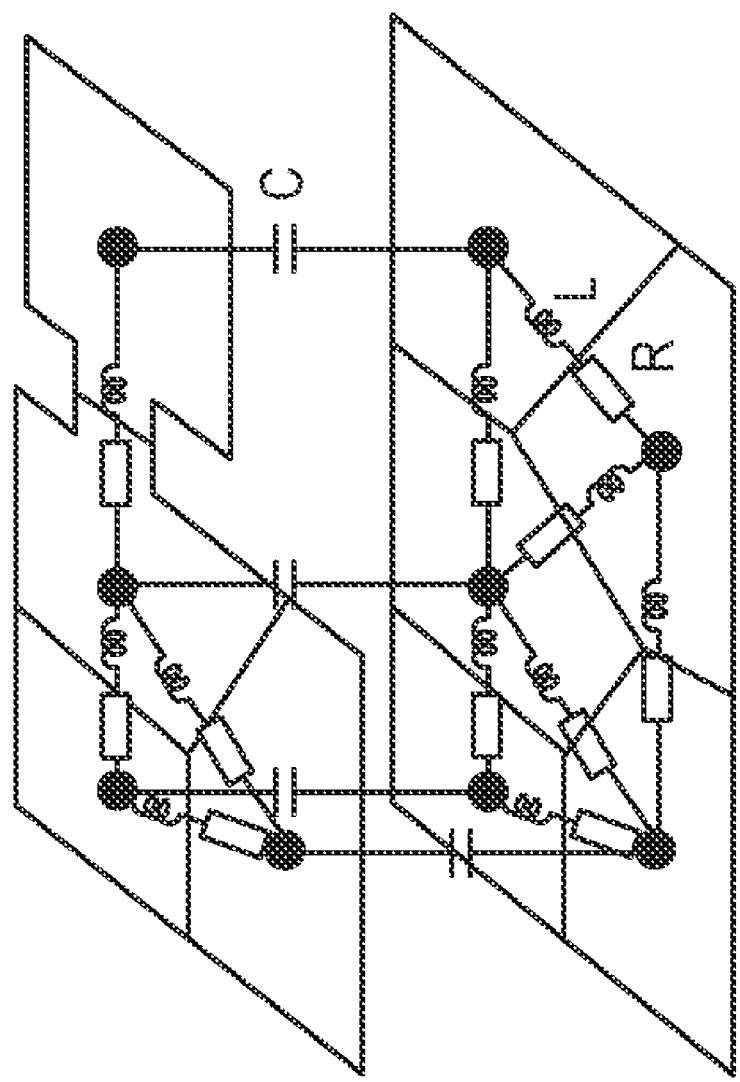
FIG. 2D is a perspective view (4) for illustrating the creation process of a power supply mesh model as a power supply noise analysis model.

FIG. 2D shows that each of the mesh shown in FIG. 2C has been converted to an equivalent circuit, such as an inductance, a capacitance or a resistance as described above.

Here, in the case of converting each mesh to an equivalent circuit such as an inductance, a capacitance or a resistance as described above, the inductance value, the capacitance value or the resistance value of the equivalent circuit such as an inductance, a capacitance or a resistance are determined on the basis of the shape of each mesh. That is, the power island structures are divided into the meshes shown in FIG. 2C, and the inductance value, the capacitance value or the resistance value of each mesh is calculated on the basis of the distance between the nodes of adjacent meshes, the length of the boundary between adjacent meshes, and the like.

Here, if the division into meshes is performed while via clearance holes are not correctly reflected, the following problem is expected to occur. That is, in this embodiment, attention is paid to a certain layer of the multi-layer circuit board, and a position where via clearance holes are provided will be considered. At a position where via clearance holes are provided and the conductor width left between the via clearance hole and an adjacent via clearance hole is narrow, the conductor resistance is relatively large. As a result, the power supply noise voltage is high. Here, the resistance value or the like of each mesh is calculated on the basis of the distance between the nodes of adjacent meshes, the length of the boundary between adjacent meshes and the like, as described above. For example, in the case of determining a resistance value, if the boundary between adjacent meshes is long, the resistance value is calculated as low because the conductor width is large. Here, for example, if division into meshes is performed by a dividing line extending along the direction of the via clearance holes adjoining one another, and avoiding the via clearance holes, then the conditions are similar to the conditions when the via clearance holes do not exist. In this case, the boundary between adjacent meshes is long, and the resistance value is calculated as low. Actually, however, since the via clearance holes exist at this position, the conductor width is narrow, and the resistance value is large. When a resistance value smaller than the actual resistance value is calculated under conditions different from the conditions of the actual shape of the circuit board like this, the power supply noise voltage is calculated as low.

Figure 3A:
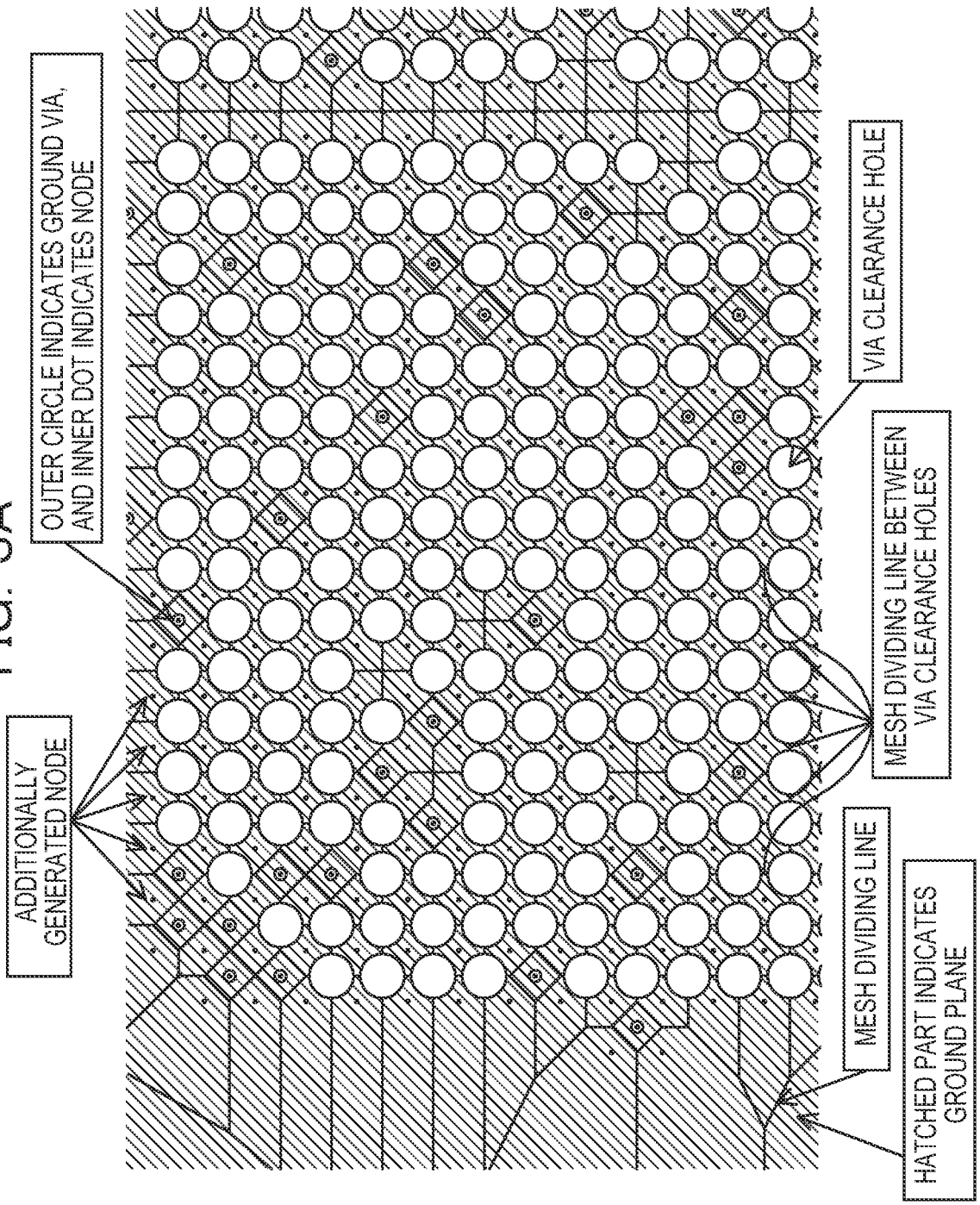
FIG. 3A is a plane view (1) for illustrating division of a ground plane into meshes according to the embodiment.

In comparison, in the embodiment, division into meshes by dividing lines extending, avoiding via clearance holes is prevented, and nodes are generated so that division into meshes is performed by dividing lines extending over the via clearance holes. FIG. 3A shows an example of the state in which division into meshes has been performed by dividing lines extending over via clearance holes. In FIG. 3A, the dividing lines extending over the via clearance holes are shown as "mesh dividing lines between via clearance holes". When division into meshes is performed by the dividing lines extending over the via clearance holes like this, the boundary between adjacent meshes is cut by the via clearance holes and shortened, and thereby the condition that the conductor width between adjacent meshes is small is obtained. That is, in this case, the meshes are separated by the via clearance holes on the boundary between adjacent meshes, and the resistance value between the meshes is calculated as larger for that. Therefore, the resistance value is calculated under conditions close to the conditions of the actual shape of the circuit board, and, consequently, the power supply noise voltage is calculated as relatively high. Therefore, more strict conditions are set as the conditions for power supply noise analysis, and, in the above processing in which the power supply noise analysis reliability is improved, division into meshes is performed at the narrowest part on the conductor plane left between adjacent via clearance holes, due to the division into meshes by the dividing lines extending over the via clearance holes.

Returning to the description of FIGS. 2A to 2D, data of a power supply pair is created next. Here, the power supply pair refers to a shape where two power island structures existing in different layers of a multi-layer circuit board face each other with an insulator between them. For example, in the case where power island structures vertically face each other as in FIG. 2B, the shape where the power supplies or the like facing each other overlap with each other when the multi-layer circuit board is viewed from directly above is the power supply pair. Division of a power supply pair into meshes is performed similar to the division of a power island structure into meshes described above. However, in the case of the power supply pair, the area is limited to the area where power island structures overlap with each other. For example, in the case of the example in FIG. 2B, when the multi-layer circuit board is viewed from directly above, the whole area of the upper-side power island structure is included in the area of the lower-side power island structure. In such a case, the overlapping area of the upper-side power island structure and the lower-side power island structure corresponds to the whole area of the upper-side power island structure, and division of the power supply pair of these two power island structures into meshes corresponds to division of the upper-side power island structure into meshes. After the division of the power supply pair into meshes, an inductance value and a capacitance value, among power supply noise analysis model parameters, are calculated on the basis of the shapes of the meshes.

In the power supply noise analysis model creation method according to the embodiment, such division into meshes is realized such that the shape of via clearance holes provided at a position on an analysis target circuit board where an LSI is to be mounted is correctly reflected. For this purpose, nodes to be the basis of division into meshes are generated on the basis of the coordinates of vias around the position where the LSI is to be mounted. More specifically, the vias around the position where the LSI is to be mounted are searched for. In this case, vias other than vias provided for drawing a wire from the LSI, which are arranged at arrangement intervals different from the arrangement intervals of the vias provided for drawing a wire from the LSI, are excluded. For this purpose, the distances between adjacent vias are calculated, and a distance which appears most frequently is obtained as a reference via pitch. Then, only such vias as correspond to the reference via pitch are targeted by processing, and the generation of nodes described above is performed on the basis of the processing target vias.

Furthermore, for the purpose of correspondence to any LSI mounting angle, the LSI mounting angle against the CAD coordinates, that is, a slope is calculated from the mutual position relation (angle) between two vias. From among the angles obtained in this way, an angle which appears most frequently is obtained as a reference via angle. Then, via coordinates obtained by rotating the coordinate axes in an opposite direction by an angle corresponding to the reference via angle are calculated. That is, it is assumed that, the LSI is mounted on the circuit board with an angle different from 90°. Here, the case where the LSI is mounted on the circuit board with an angle different from 90° refers to the case as described below. That is, it is the case that the surrounding four sides of the LSI having a rectangular appearance are not parallel to each of the CAD XY coordinate axes for designing a circuit board and are inclined. In the embodiment, the inclination angle is obtained as the reference via angle. Then, by rotating the via coordinates in the opposite direction of the reference via angle, the state in which the LSI is parallel to each of the XY coordinates is obtained. By measuring the reference via pitch in that state, a correct value can be obtained as the reference via pitch.

Next, the generation of nodes described above will be described. In the embodiment, nodes are generated in a manner that division into meshes is performed at the narrowest part of a conductor plane left between adjacent via clearance holes as described above. For this purpose, new nodes are generated in four directions around vias in the embodiment. Each of the new nodes in the four directions is provided at the position of the middle point on the line connecting each via and an adjacent via in each of the four oblique directions. As a result, for example, as shown in FIG. 3A, such division into meshes is performed that dividing lines cross the narrowest parts of a power supply or a ground plane left around via clearance holes. That is, division into meshes becomes possible in which dividing lines dividing the meshes (that is, boundary lines between adjacent meshes, hereinafter the same) cross band-shaped parts which are narrow parts of the power supply or the ground plane left between adjacent via clearance holes. The division into meshes in which dividing lines cross band-shaped parts which are narrow parts of the power supply or the ground plane left between adjacent via clearance holes refers to the case described below. That is, it is division into meshes performed by dividing lines extending in the direction orthogonal to the direction in which the extending narrow band-shaped parts left between adjacent via clearance holes.

In FIG. 3A, black dots indicate the new nodes generated by the generation of nodes described above. In the example in FIG. 3A, it is seen that the new nodes exist in the four directions of the upper-left, upper-right, lower-left and lower-right directions for each of via clearance holes indicated by white circles. Here, through the center of each via clearance hole in the layer of the ground plane, a via for connection to a different layer passes. Therefore, in the example in FIG. 3A, for each of the vias passing the via clearance holes, the new nodes described above exist in the oblique four directions of the upper-left, upper-right, lower-left and lower-right directions. Furthermore, for each via, the new nodes in the four directions are provided at the positions of the middle points on the lines connecting the via and adjacent vias in the four oblique directions, as described above. The processing for generating new nodes in the four directions of a via will be described later with reference to FIGS. 7, 13A and 13B. On the basis of the new nodes, and nodes generated for vias on the ground in FIG. 3A (in the figure, black dots shown inside circles with a short diameter), division into meshes is performed. In the division of meshes, the perpendicular bisector of a line segment connecting two adjacent nodes, among the nodes, is a dividing line, as described later. As described above, new nodes are generated in the four directions of the upper-left, upper-right, lower-left and lower-right directions of each via (that is, a via clearance hole). Each of the new nodes in the four directions is provided at the position of the middle point on the line connecting each via and an adjacent via in each of the four oblique directions. As a result, a mesh dividing line which is the perpendicular bisector of a line segment connecting two adjacent nodes crosses almost the center of each via. As a result, mesh dividing lines extend crossing the band-shaped conductor parts left between adjacent via clearance holes as described above and extend connecting adjacent via clearance holes with the shortest distance. The mesh dividing lines are indicated as "mesh dividing lines between via clearance holes" in FIG. 3A.

The power supply noise analysis model creation method according to the embodiment is further desirable in that, at the time of generating the new nodes in the four directions of the vias, the new nodes are not generated if a node already exists near the coordinates at which the new nodes are to be generated. Generation of new nodes enables more fine division into meshes, and as a result, more accurate analysis is enabled. However, the time required for the analysis operation increases for that. Therefore, when it is judged that generation of new nodes does not contribute to improvement of analysis accuracy much, it is desirable not to generate the new nodes. If new nodes are generated near a node which already exists, it is conceivable that an effect similar to the effect of the new nodes can be obtained from the node which already exists itself, with regard to division into meshes. Consequently, it is thought to contribute little to improvement of the analysis accuracy to generate new nodes near the node which already exists, and it is thought to be efficient not to perform the generation.

Figure 3B:
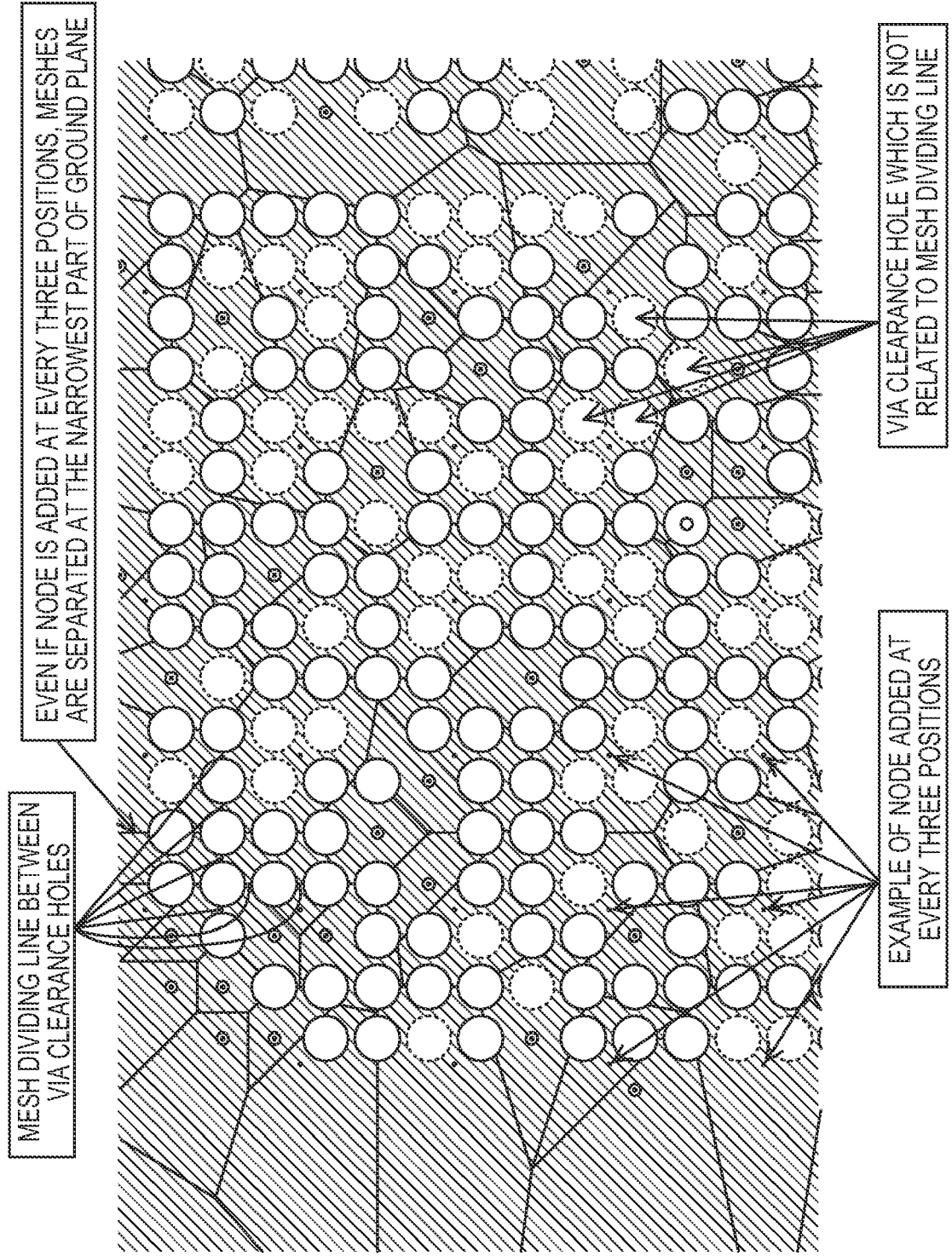
FIG. 3B is a plane view (2) for illustrating division of a ground plane into meshes according to the embodiment.

At the time of generating new nodes in the four directions of the vias, the new nodes may be generated at every three positions. That is, in this case, at the time of newly generating nodes in the four directions of the via as described above, the nodes to be newly generated may be thinned out at intervals of a predetermined number of nodes. The processing for thinning out the nodes to be newly generated at intervals of a predetermined number of nodes will be described later with reference to FIGS. 8, 14 and the like. By reducing the number of nodes to be newly generated, in this way, it is possible to reduce the size of an obtained power supply noise analysis model without lowering the analysis accuracy much as a result. Specifically, for example, in the case of the example shown in FIG. 3B, the number of additionally generated nodes, which are indicated by black dots, is small in comparison with FIG. 3A described above. In FIG. 3B, the additionally generated nodes are indicated as an "example of nodes added at every three positions". Therefore, new nodes are not generated in the four directions of the upper-left, upper-right, lower-left and lower-right directions of all the vias, unlike the case of FIG. 3A. However, even in the case of FIG. 3B, mesh dividing lines indicated by solid lines extend as described below, similarly to the case of FIG. 3A. That is, in many cases, mesh dividing lines extend as dividing lines which cross the band-shaped conductor parts left between adjacent via clearance holes, which are line segments connecting adjacent via clearance holes with the shortest distance, as described above. The mesh dividing lines are indicated as "mesh dividing lines between via clearance holes" in FIG. 3B similar to FIG. 3A. In many cases other than the above case, mesh dividing lines also extend as line segments connecting adjacent via clearance holes. Therefore, even in the case of FIG. 3B, that is, even in the case of generating new nodes at every three positions, an effect close to the effect in the case of generating new nodes in the four directions of the upper-left, upper-right, lower-left and lower-right directions of all the vias can be obtained, like the case of FIG. 3A. Here, in FIG. 3B, white circles by broken lines shown as "via clearance holes which are not related to mesh dividing lines" are not related to the mesh dividing lines described above. Since these via clearance holes are not taken into consideration in division into meshes, they may be a factor in errors at the time of performing analysis. However, even in the case of FIG. 3B, the number of the via clearance holes indicated by broken lines is not so large, compared to the number of via clearance holes touched by the mesh dividing lines, which are indicated by solid lines. Therefore, the influence given on the analysis accuracy is thought not to be so great.

The power supply noise analysis model creation method according to the embodiment will be described in detail with reference to FIGS. 4 to 15.

Figure 4:
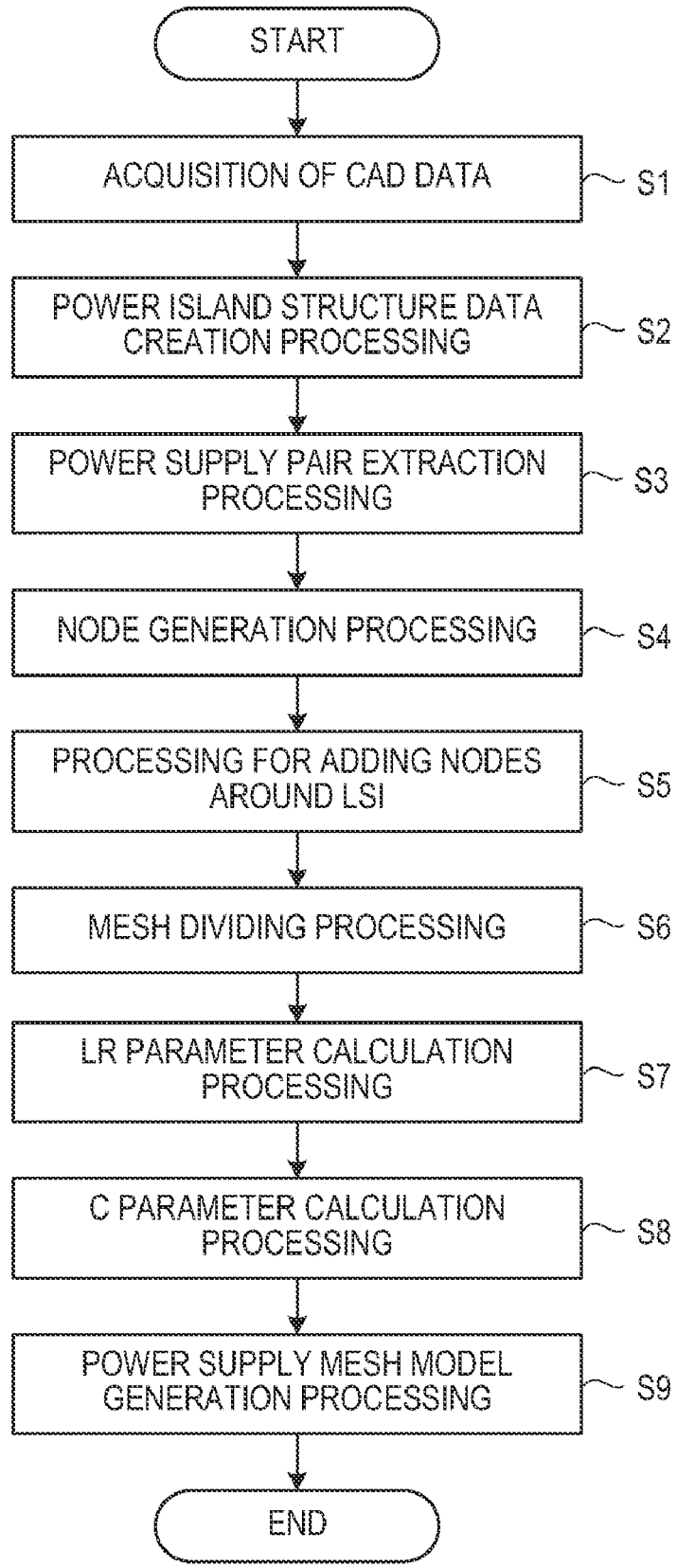
FIG. 4 is a flowchart for illustrating the flow of the processing by a power supply noise analysis model creation method according to the embodiment.
Figure 16:
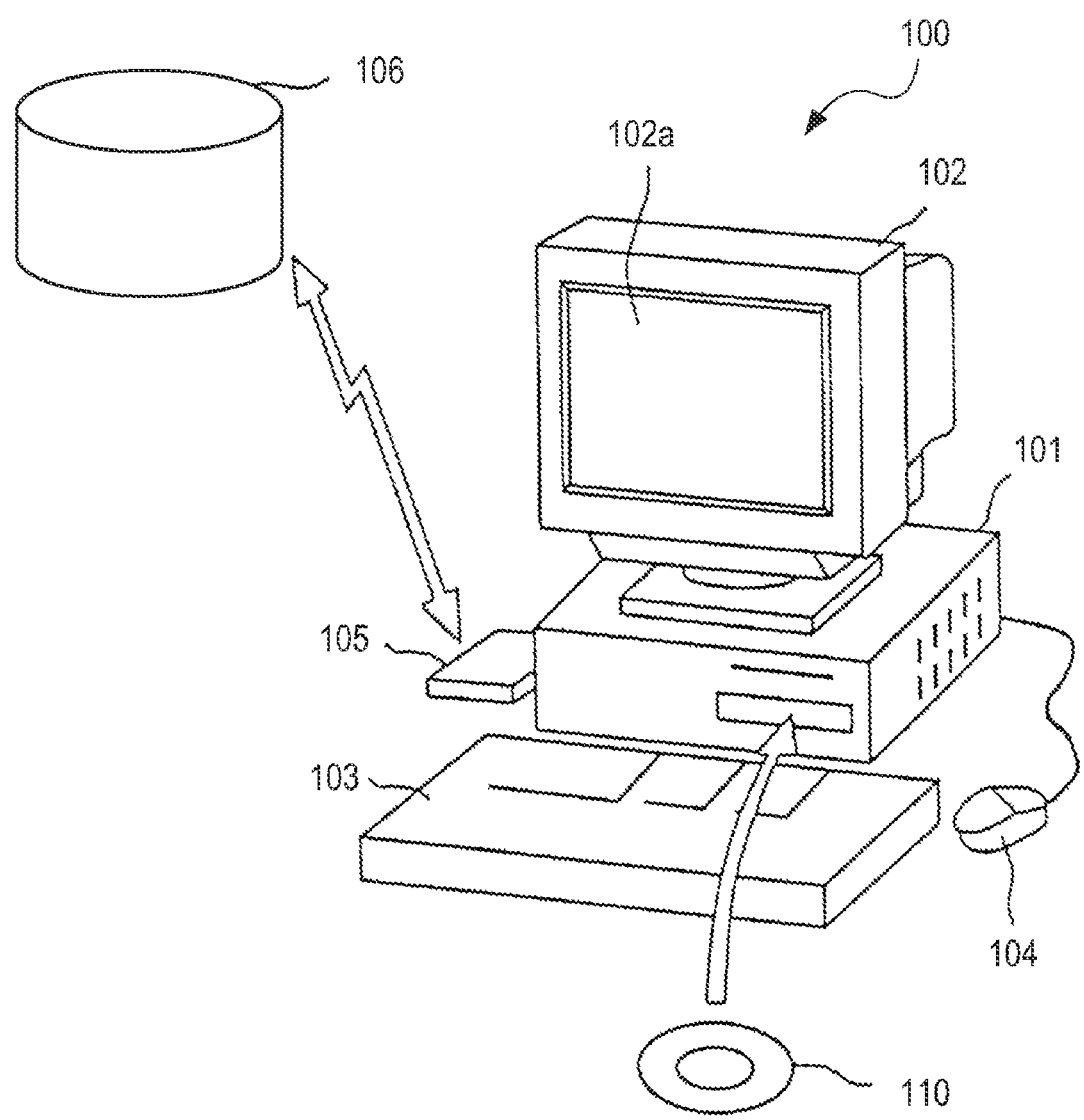
FIG. 16 is a perspective view showing a computer system used when the power supply noise analysis model creation method according the embodiment is executed by the computer.
Figure 17:
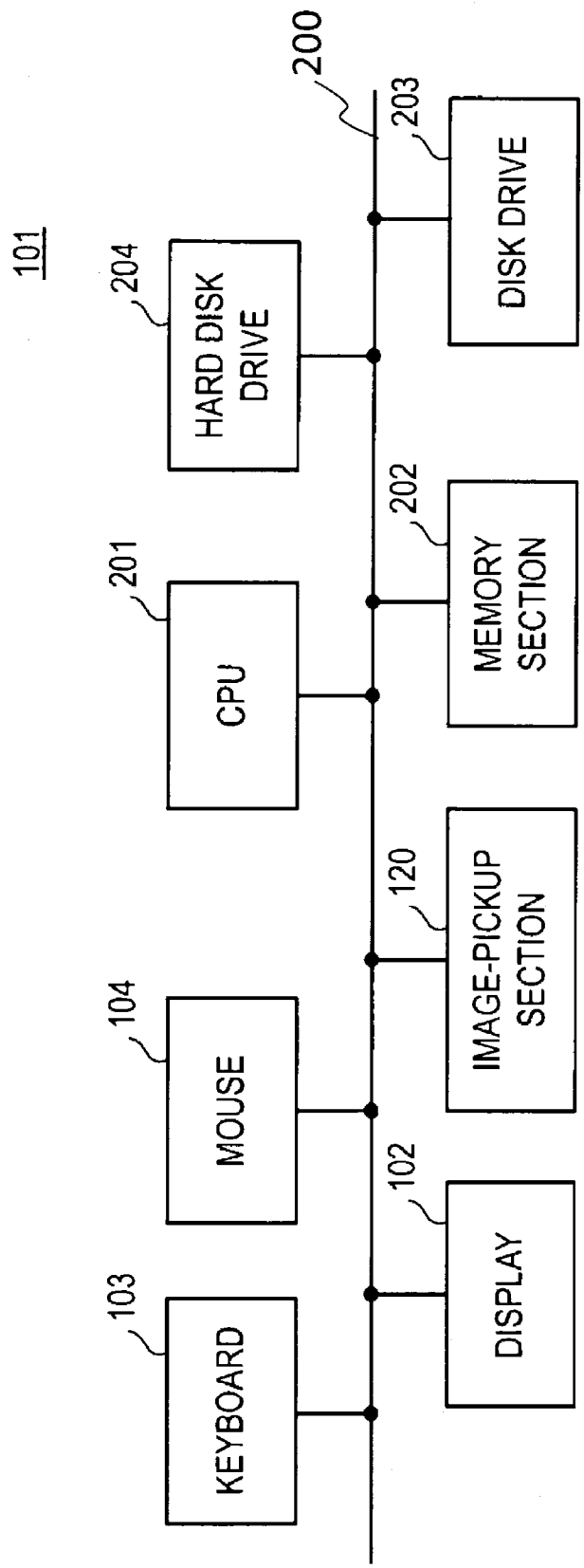
FIG. 17 is a block diagram for illustrating the configuration of main sections in the body section of the power supply noise computer system according to the embodiment.

FIG. 4 is a flowchart showing the flow of the power supply noise analysis model creation method according to the embodiment. The power supply noise analysis model creation method is automatically executed by a computer as shown in FIGS. 16 and 17 executing the power supply noise analysis model creation program.

First, the user sets the following two pieces of information for the computer: how many millimeters is the range targeted by node addition processing to be expanded from the rectangle surrounding the pins of the LSI by (usually about 5 mm), and whether processing for generating nodes at every three positions is to be ON or OFF (ON is set when the model size is to be suppressed as much as possible).

In FIG. 4, the computer obtains CAD data at step S1. That is, the computer obtains power supply-related and ground-related data from CAD data indicating the PCB layout of a multi-layer circuit board targeted by analysis, which corresponds to the CAD data 1 in FIG. 1.

Next, at step S2, the computer performs power island structure data creation processing. That is, the computer synthesizes shape data of power supply conductors or grounding conductors which are electrically connected with one another, for each layer of the multi-layer circuit board, from the CAD data obtained at step S1 to create power island structure data as described above with reference to FIG. 2B.

Next, at step S3, the computer performs power supply pair extraction processing. That is, the computer uses the power island structure data created at step S2 to extract a shape where two power island structures in different layers face each other with an insulating layer between them, as a power supply pair.

Next, at step S4, the computer performs node generation processing. That is, for each of the power island structures and the power supply pair, the computer generates nodes at positions where the LSI pins are connected and positions where vias are connected on the power supply conductors or the grounding conductors related to the power island structures or the power supply pair. Furthermore, the computer generates the nodes at predetermined intervals, for the power island structures and the power supply pair as necessary.

Next, at step S5, the computer performs processing for adding nodes around the LSI, for each of the power island structures and the power supply pair, similar to the case of step S4 described above. The processing for adding nodes around the LSI described above will be described below in details with reference to FIGS. 5A to 15.

Figure 9:
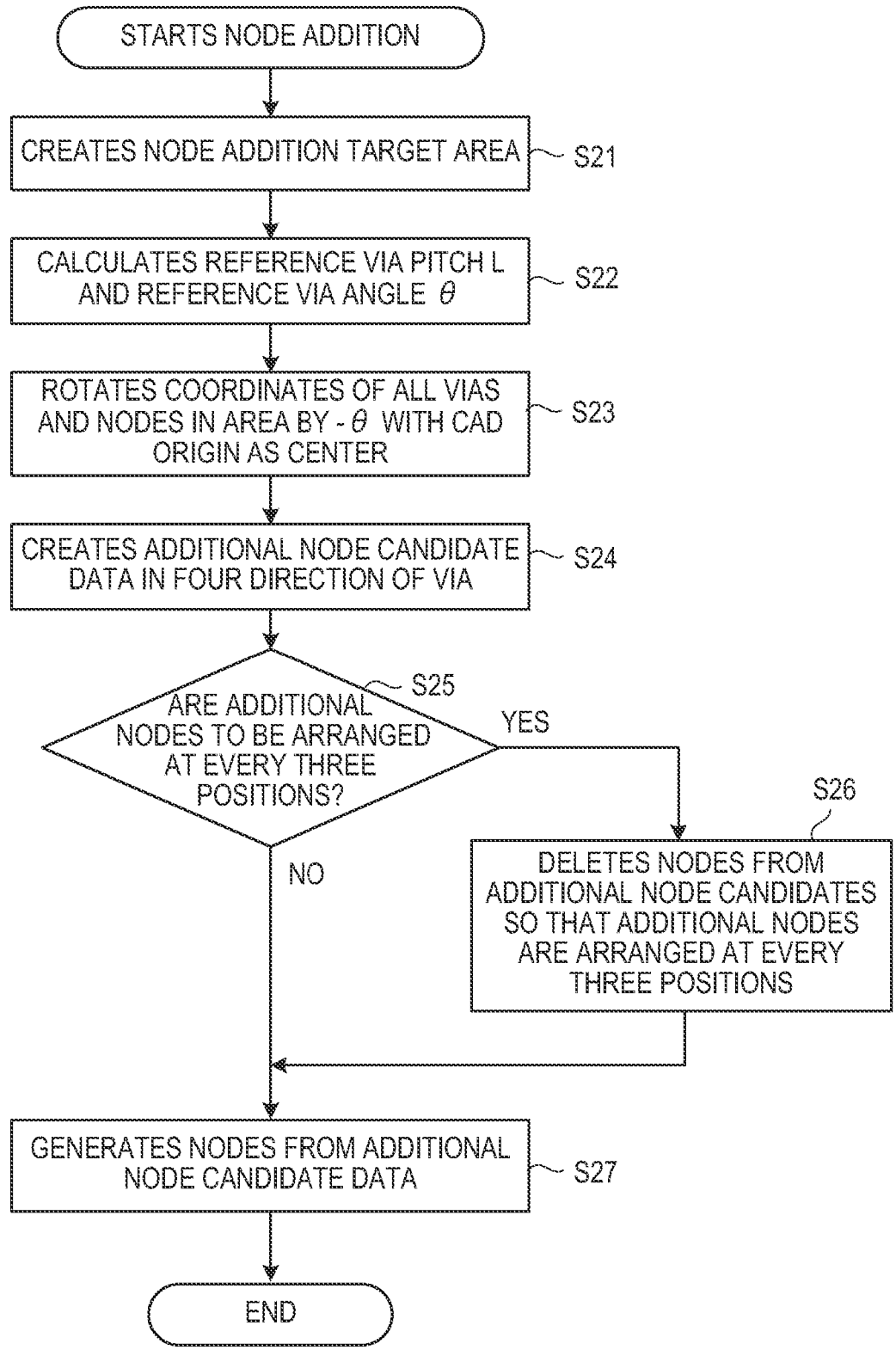
FIG. 9 is a flowchart for illustrating the flow of the node addition processing in the power supply noise analysis model creation method according to the embodiment.

First, at step S21 in FIG. 9, the computer determines a node addition target area (that is, a processing target area). That is, for an LSI which is to be mounted on the multi-layer circuit board and which is to be targeted by noise amount measurement in power supply noise analysis, the computer determines a rectangular area A (an area A in FIG. 5A) surrounding the pins of the LSI. Furthermore, the computer acquires an area B (an area B in FIG. 5A) obtained by extending each side of the area A toward the outside by the length required to expand the range to be targeted by the node addition processing from the rectangle surrounding the pins of the LSI, according to the setting by the user. The area B is the processing target area.

Next, the computer obtains the data of all the nodes which already exist inside the area B and stores their node coordinates in a table B (a table B in FIG. 6B) as (Nx1, Ny1). Here, "all the nodes" refers to the nodes generated at step S4.

Next, the computer calculates a reference via pitch and a reference via angle at step S22 in FIG. 9. First, the computer calculates the reference via pitch. Reference via pitch calculation processing will be described below with reference to FIG. 10.

Figure 10:
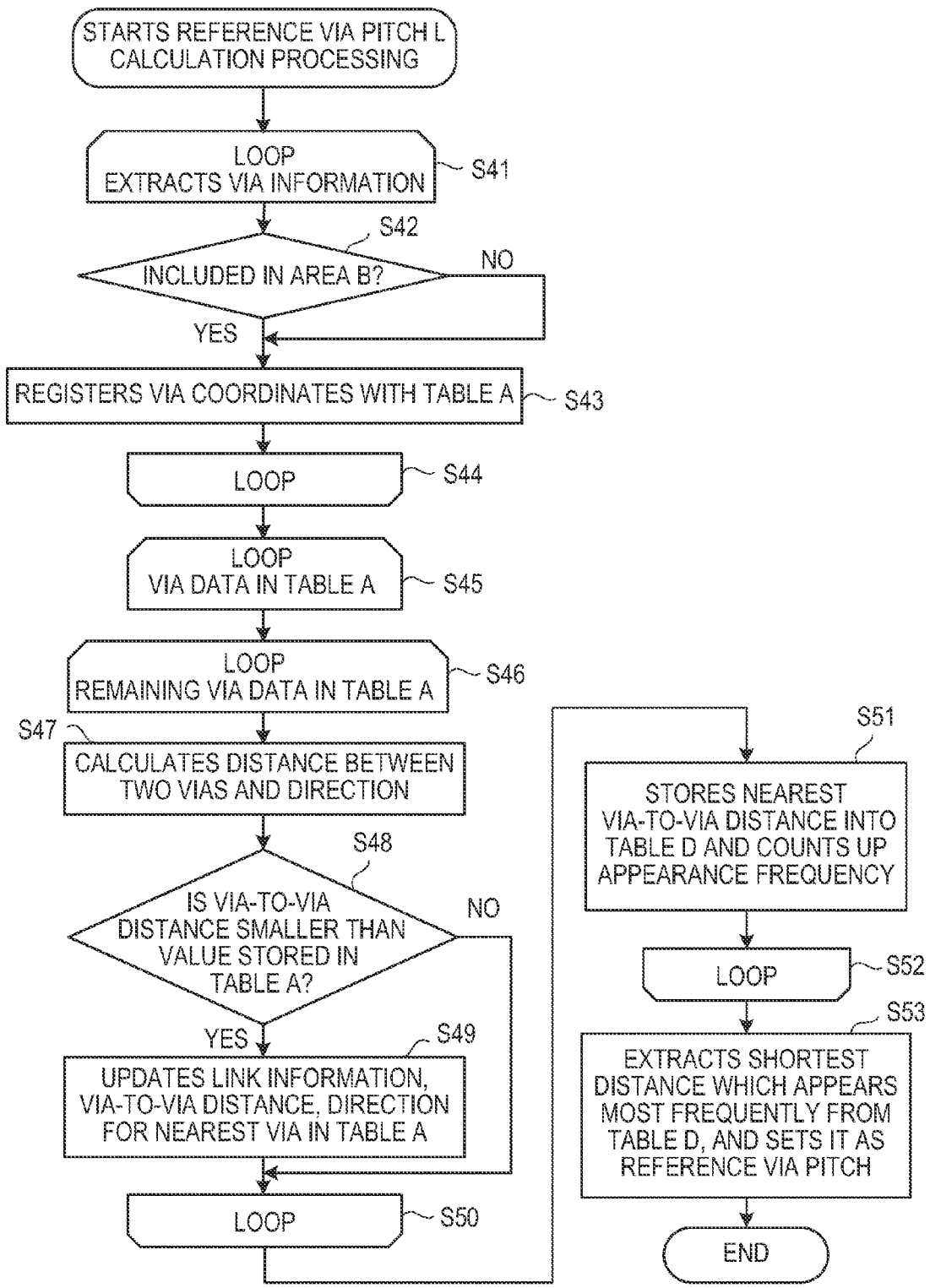
FIG. 10 is a flowchart for illustrating the flow of reference pitch calculation processing in the power supply noise analysis model creation method according to the embodiment.
Figure 11:
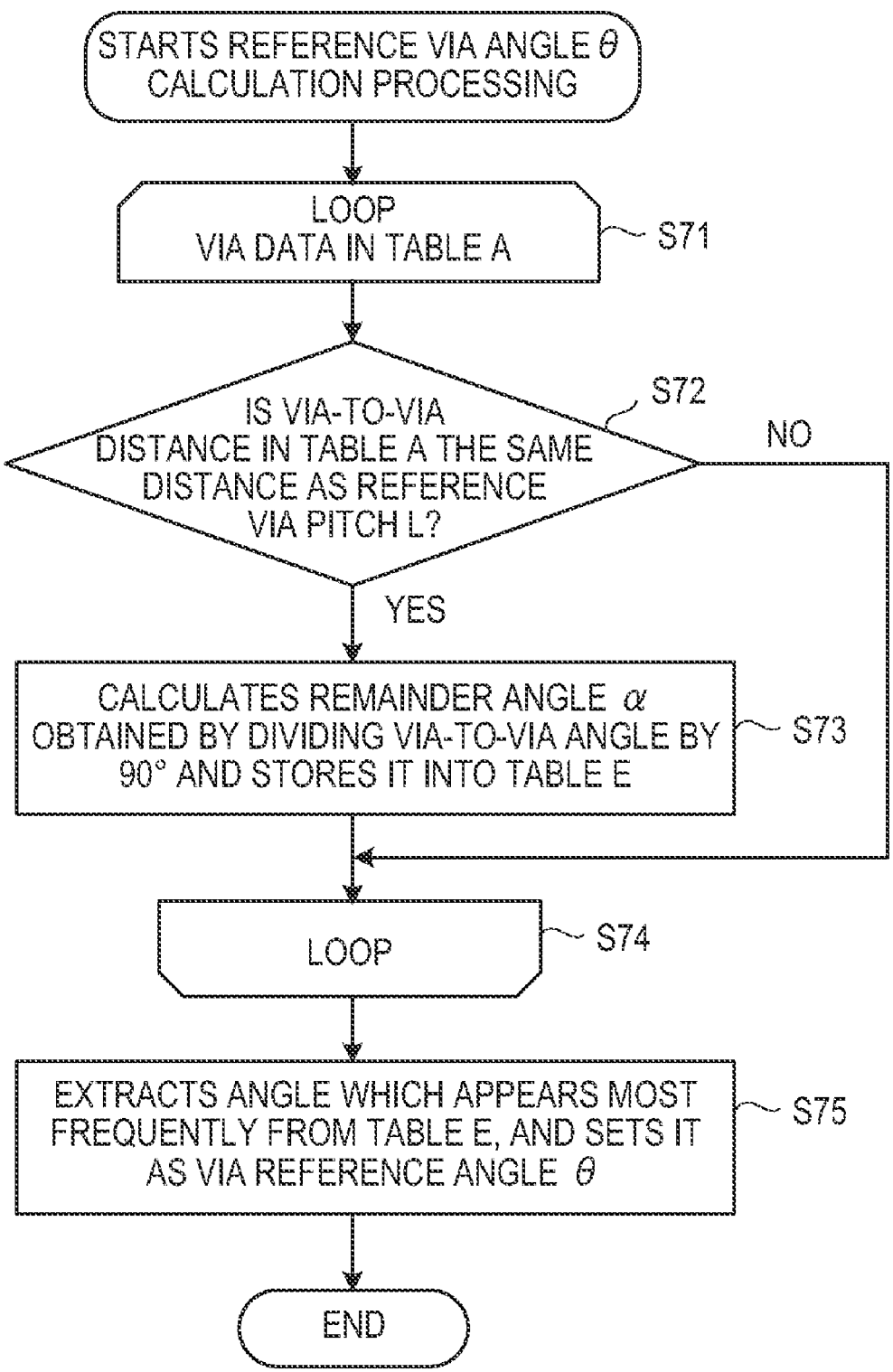
FIG. 11 is a flowchart for illustrating the flow of reference via angle θ calculation processing in the power supply noise analysis model creation method according to the embodiment.

First, the computer obtains the data of all the vias which exist inside the area B from the CAD data described above and stores the via coordinates into a table A (a table A in FIG. 6A) as (Vx1, Vy1) (steps S41, S42, S43 and S44 in FIG. 10). "All the vias" refers to all the vias existing inside the area B among the vias provided in the analysis target multi-layer circuit board.

Next, the computer references one of the vias in the table A. Then, the computer determines distances between the via and all the vias remaining in the table A (step S47). Then, the computer determines the nearest via (step S48). Information about the link to the data of the via found at step S48, the distance and the angle are stored into the table A (step S49). The angle in this case means an angle when the rotation direction of the CAD data coordinate axes from the +X axis to the +Y axis is assumed to be positive (hereinafter the same). If multiple vias with the same direction are found, the computer can adopt a via found first.

Next, the computer stores the distances from the nearest vias found through steps S47 to S50 into a table D (table D in FIG. 6A) and counts the appearance frequency for each distance (step S51).

Then, the computer performs the processing from S46 to S51 for all the vias in the table A (steps S45 to S52).

Next, the computer sets the distance which appears most frequently, in the table D created through steps S45 to S52 as a reference via pitch L (step S53).

Next, the reference via angle is calculated. Reference via angle calculation processing will be described below with reference to FIG. 11.

First, if the distance from the nearest via corresponds to the reference via pitch L (step S72: YES), the computer determines an "angle α", which is the remainder obtained by dividing the angle with the nearest via by 90°, and stores each of the values into a table E (a table E in FIG. 6E). Then, the appearance frequency of each value of the angle α is counted (step S73).

Next, the computer performs the processing of steps S72 and S73 for all the vias in the table A (steps S71 to S74). Furthermore, the computer sets the angle which appears most frequently, in the table E created through steps S71 to S74, as a reference via angle θ (step S75).

Figure 12:
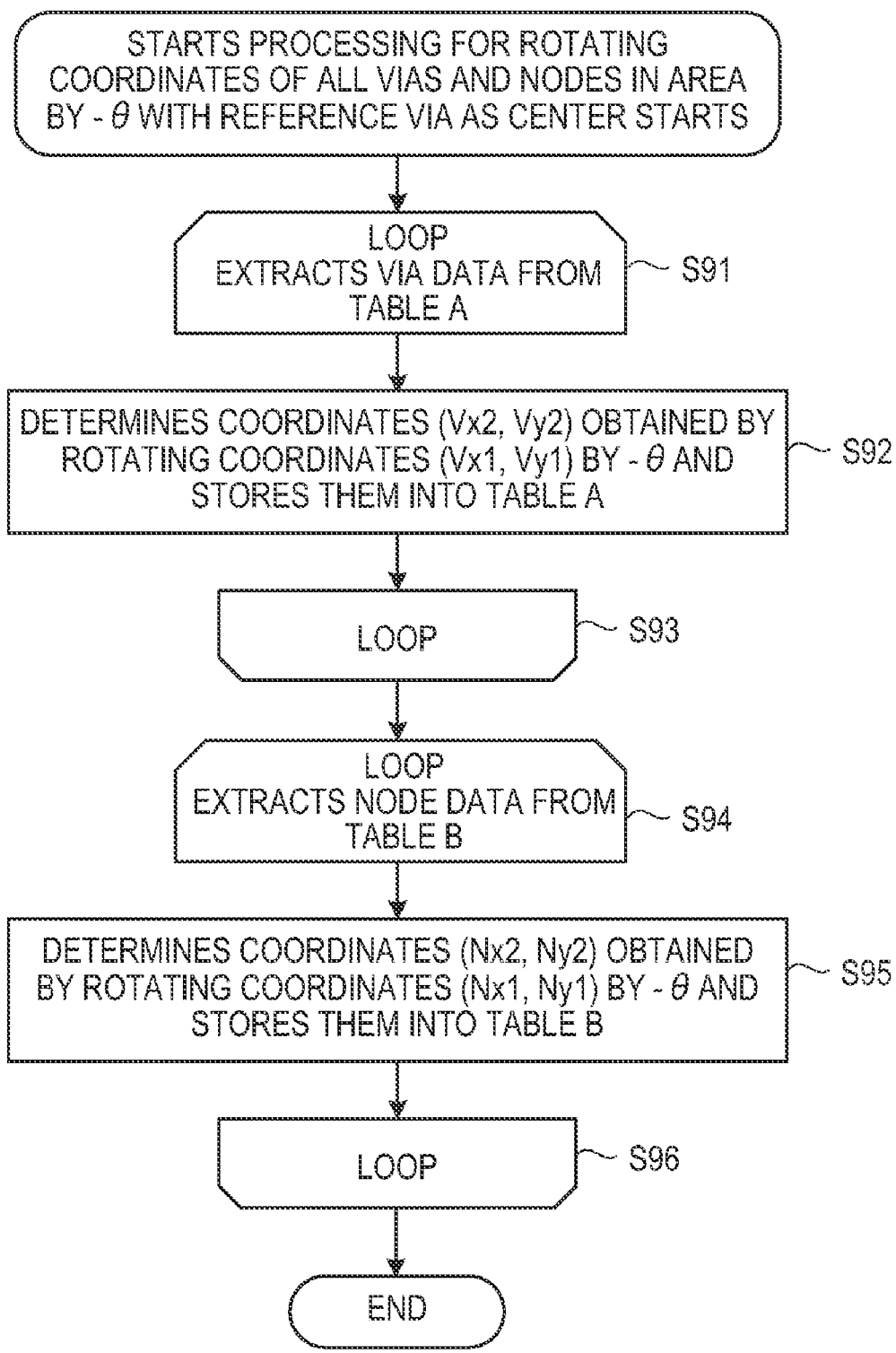
FIG. 12 is a flowchart for illustrating the flow of processing for rotating via coordinates and node coordinates in the power supply noise analysis model creation method according to the embodiment.

Returning to FIG. 9, at step S23, the computer rotates the coordinates of all the vias and nodes in the node addition target area determined at step S21 (that is, the processing target area described above) in the minus direction by an angle corresponding to the reference via angle θ with the CAD origin as the center. FIG. 12 is a flowchart for illustrating the processing of step S23 in detail. First, for all the vias in the table A, the computer determines coordinates (Vx2, Vy2) obtained by rotation by −θ with the CAD origin as the center, and stores them into the table A (steps S91 to S93 in FIG. 12). Similarly, for all the nodes in the table B, the computer determines coordinates (Nx2, Ny2) obtained by rotation by −θ with the CAD origin as the center, and stores them into the table B (steps S94 to S96).

Figure 13A:
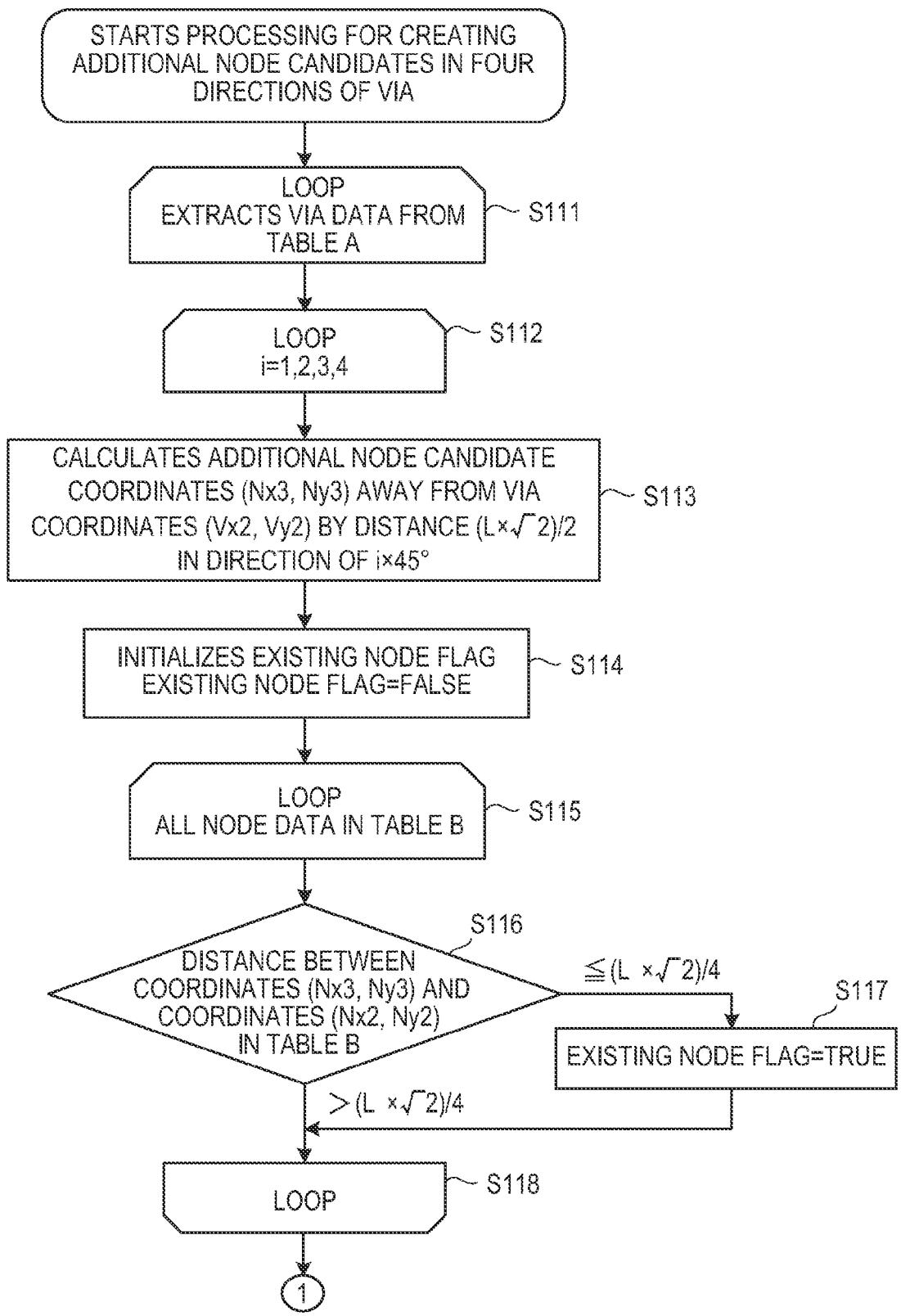
FIG. 13A is a flowchart (1) for illustrating the flow of processing for creating additional node candidate data in four directions of a via in the power supply noise analysis model creation method according to the embodiment.
Figure 13B:
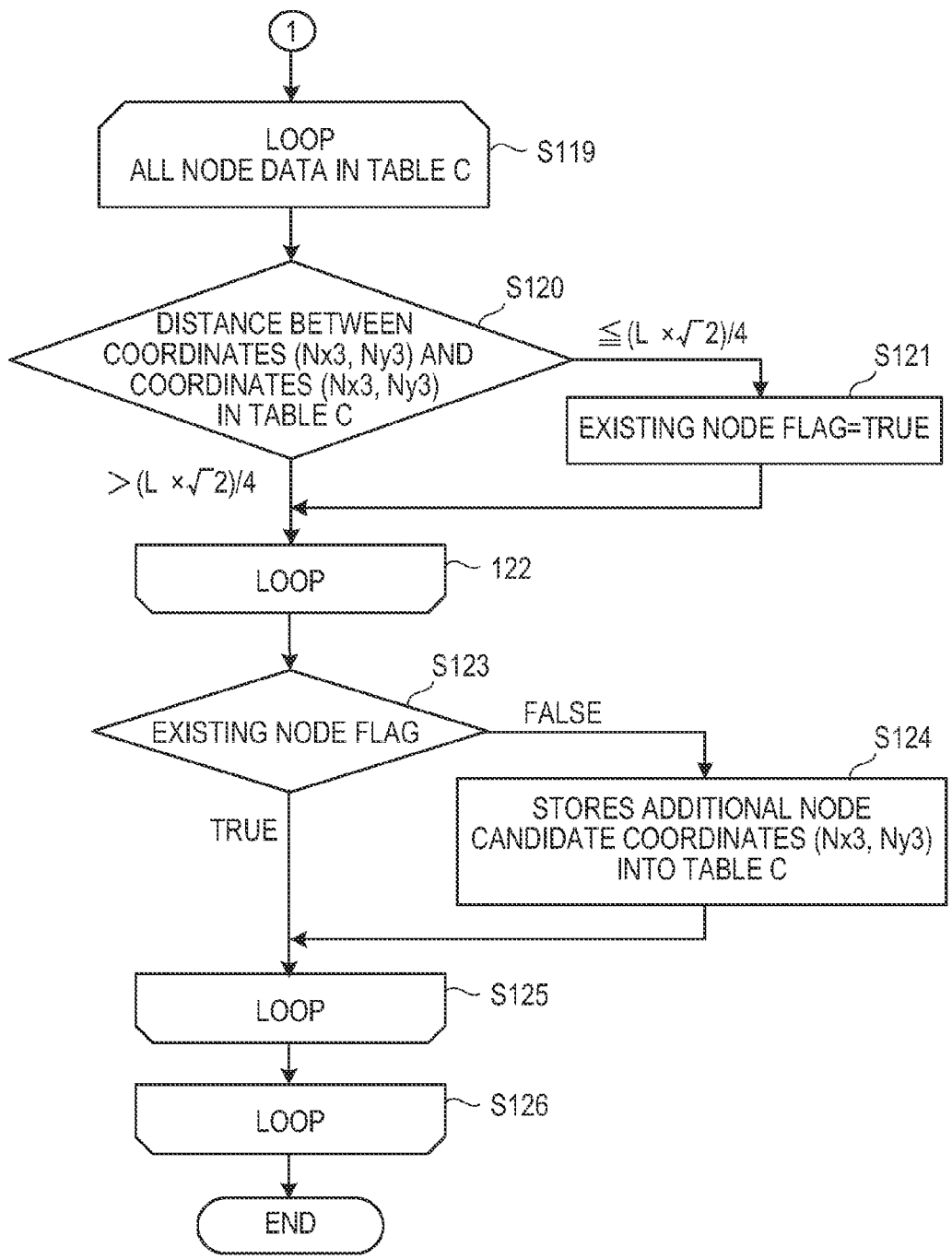
FIG. 13B is a flowchart (2) for illustrating the flow of processing for creating additional node candidate data in four directions of a via in the power supply noise analysis model creation method according to the embodiment.

Next, at step S24, the computer creates the data of additional node candidates in the four directions of the vias. FIGS. 13A and 13B are flowcharts for illustrating the processing of step S24 in detail.

Figure 7:
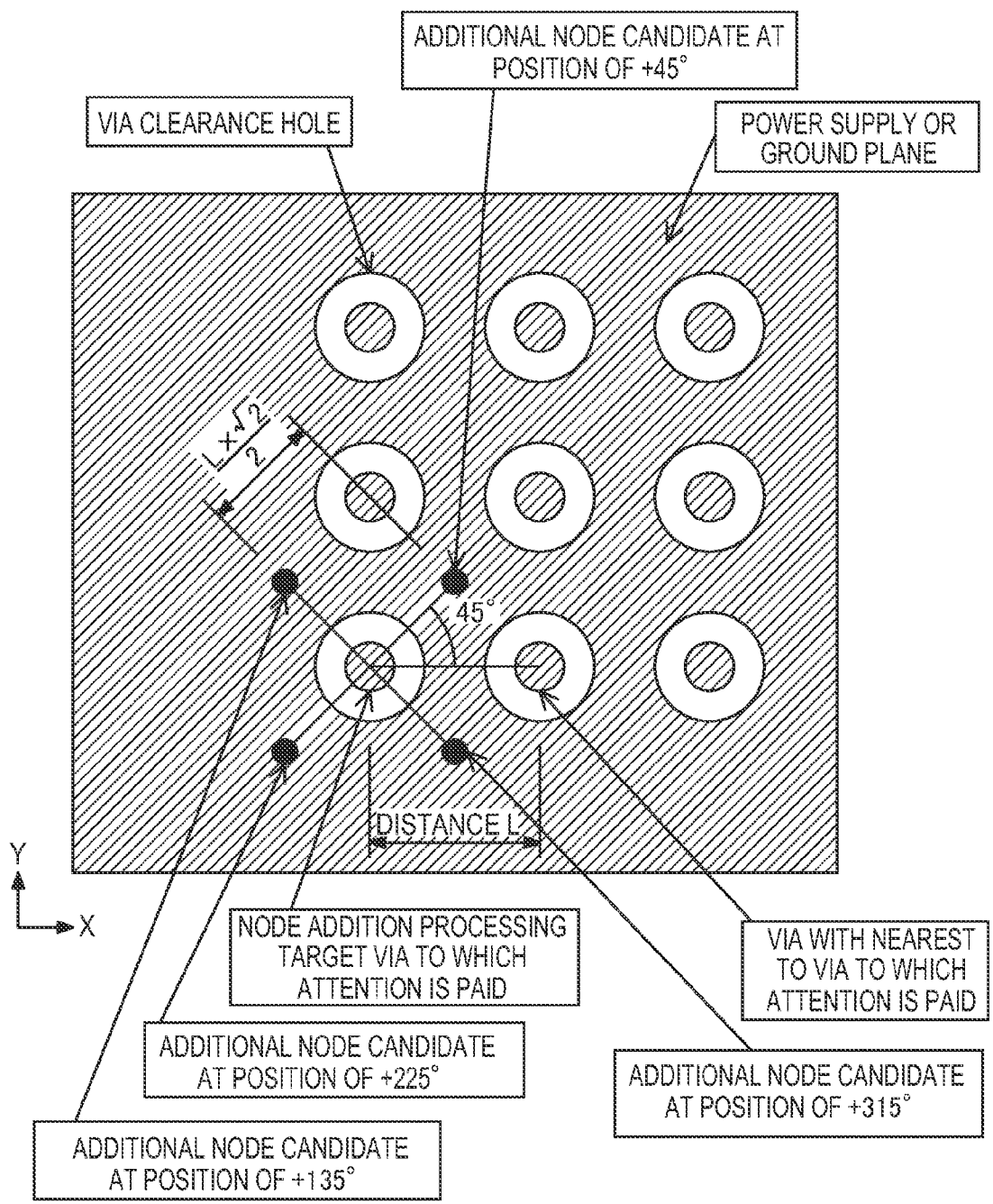
FIG. 7 is a plane view for illustrating the node addition processing in the power supply noise analysis model creation method according to the embodiment.

First, attention is paid to one of the vias in the table A. Then, if the distance from the nearest via corresponds to the reference via pitch L, the computer performs the following processing for the coordinates (Vx2, Vy2) of the via to which attention is paid. That is, the computer obtains coordinates at a distance of $(L \times \sqrt{2})/2$ from the coordinates (Vx2, Vy2) of the via in the four directions of +45°, +135°, +225° and +315°, as coordinates (Nx3, Ny3) at which additional node candidates are to be generated (steps S112, S113 and S125 in FIG. 13A). For example, as illustrated in FIG. 7, the coordinates of the additional node candidates correspond to an additional node candidate at the position of +45°, an additional node candidate at the position of +135°, an additional node candidate at the position of +225° and an additional node candidate at the position of +315°. By the additional node candidate generation method, four additional node candidates having the following relation with the via to which attention is paid are generated. That is, the case in which vias are two-dimensionally arrayed with the reference via pitch L as shown in FIG. 3A or FIG. 7 (that is, the case of arraying the vias at the intersections of a grid) can be assumed. However, in the case of FIG. 3A, each via is shown as a via clearance hole. In this case, a case can be assumed in which, for one of the two-dimensionally arrayed vias, a total of four nodes are generated, each of which is generated at almost the middle point of each of the line segments connecting the via and four adjacent vias in four directions oblique to the reference via pitch L. The position relations between the via to which attention is paid and four additional node candidates generated for the via correspond to the position relations between the one via and the four nodes in the assumed case. The direction of the reference via pitch refers the direction in which the reference via pitch is measured. In the case in FIG. 3A or FIG. 7, the direction refers to the directions of the grid extending vertically and horizontally to the vias or via clearance holes arrayed at the intersections of the grid as shown in the figure.

Next, the computer sets the initial value of an existing node flag to be described later as False (step S114 in FIG. 13A). Then, the computer judges whether there is not any node with the node coordinates (Nx2, Ny2) in the table B, within the distance of $(L \times \sqrt{2})/4$ from the additional node candidate coordinates (Nx3, Ny3) (steps S115 to S118 in FIG. 13A). If there is any relevant node, the computer sets the existing node flag as True (step S117). Similarly, the computer judges whether there is not any node with the node coordinates (Nx3, Ny3) in the table C (table C in FIG. 6C), within the distance of $(L \times \sqrt{2})/4$ from the additional node candidate coordinates (Nx3, Ny3) (steps S119 to S122 in FIG. 13B). If there is any relevant node, the computer sets the existing node flag as True (step S121). Then, if there is not any relevant node at all (step S123: False), the computer stores the additional node candidate coordinates (Nx3, Ny3) into the table C (step S124). In this case, the computer keeps the initial value of a deletion flag in the table C to be described later as False. The computer performs the processing from steps S112 to S125 for all the vias in the table A (steps S111 to S126).

Figure 14:
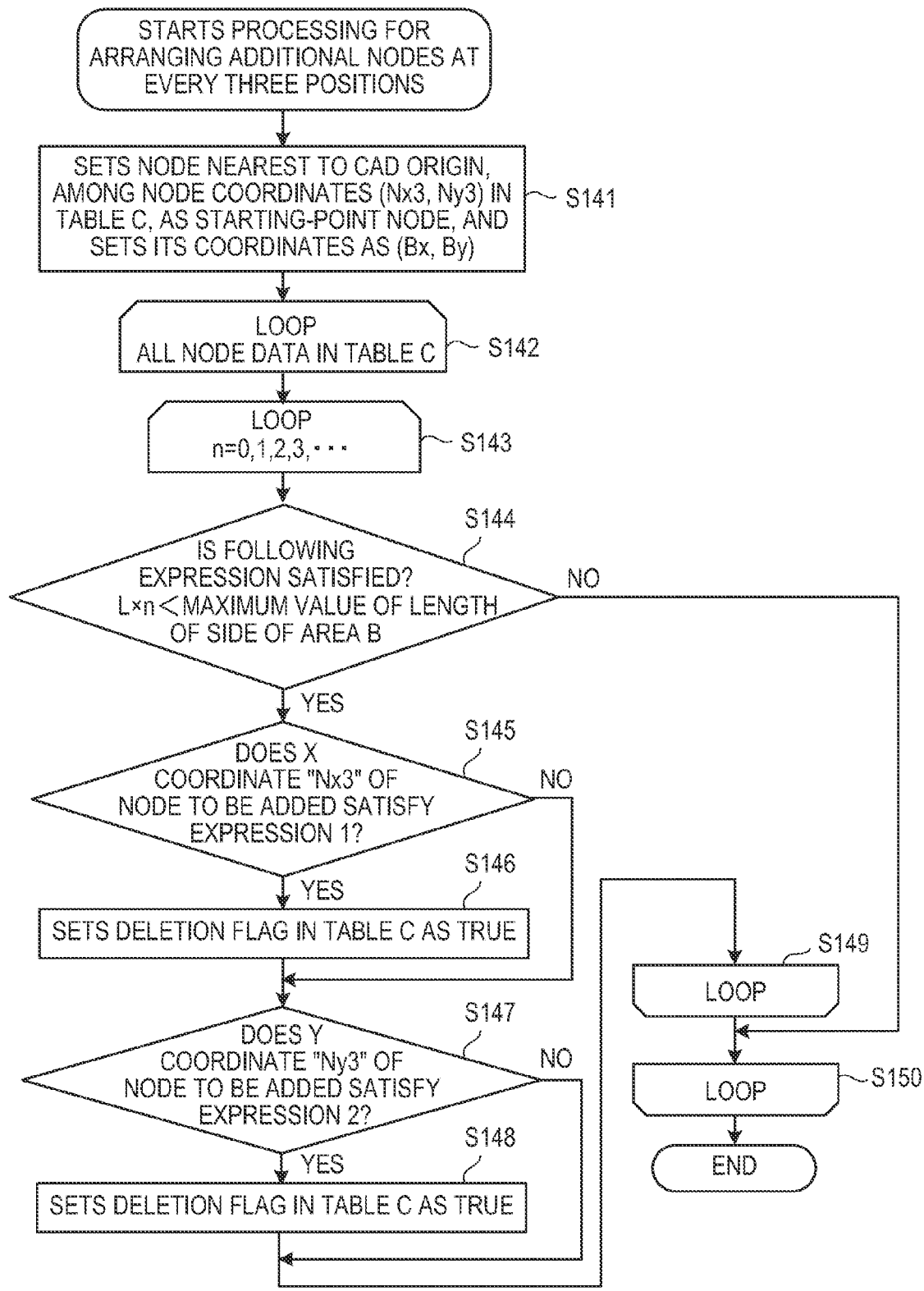
FIG. 14 is a flowchart for illustrating the flow of the processing for arranging nodes at every three positions in the power supply noise analysis model creation method according the embodiment.

Returning to FIG. 9, the computer judges whether or not the setting of arranging additional nodes at every three positions has been made by the user, at step S25. The setting by the user corresponds to a user input 2 in FIG. 1. If the setting of arranging additional nodes at every three positions has been ON by the user (step S25: YES), the processing of step S26 is performed. That is, the computer deletes additional node candidates which satisfy a predetermined condition from the additional node candidates created at step S24. FIG. 14 is a flowchart for illustrating the processing of step S26 in detail.

In FIG. 14, at step S141, the computer sets an additional node candidate which is the nearest to the CAD origin, among the additional node candidates stored in the table C, as a starting-point node and sets its coordinates as (Bx, By).

Next, the computer references one of the additional node candidates in the table C. Then, the computer judges whether or not the coordinates (Nx3, Ny3) of the additional node candidate referenced satisfies any of the conditions of the following expressions 1 and 2 (steps S144 and S146).

$$Bx+L \times n+L \div 4 < Nx3 < Bx+L \times n+(5 \times L) \div 2 \quad \text{Expression 1}$$

$$By+L \times n+L \div 4 < Ny3 < By+L \times n+(5 \times L) \div 2 \quad \text{Expression 2}$$

If the X coordinate (Nx3) of the additional node candidate satisfies the condition of the above expression 1 (step S145: YES), the computer sets the deletion flag in the table C as True (step S146). If the Y coordinate (Ny3) of the additional node candidate satisfies the condition of the above expression 2 (step S147: YES), the computer sets the deletion flag in the table C as True (step S148). For example, in the example in FIG. 8, the case in which step S145 or the judgment result of step S145 is YES is the case in which the additional node candidate is a thinning-out target node within the node thinning-out area.

Here, n described above is assumed to be an integer of 0 or more (0, 1, 2, ...) which satisfies the following expression:

$$L \times n < \text{the maximum value of the length of the side of the area } B \quad \text{Expression 3}$$

If the condition of the expression 3 is satisfied, the judgment result at step S144 is YES. The computer executes steps S144 to S148 for n which is an integer of 0 or more (0, 1, 2, ...) (steps S143 to S149). Then, the computer performs the processing from steps S143 to S149 for all the additional node candidates in the table C (steps S142 to S150).

Figure 8:
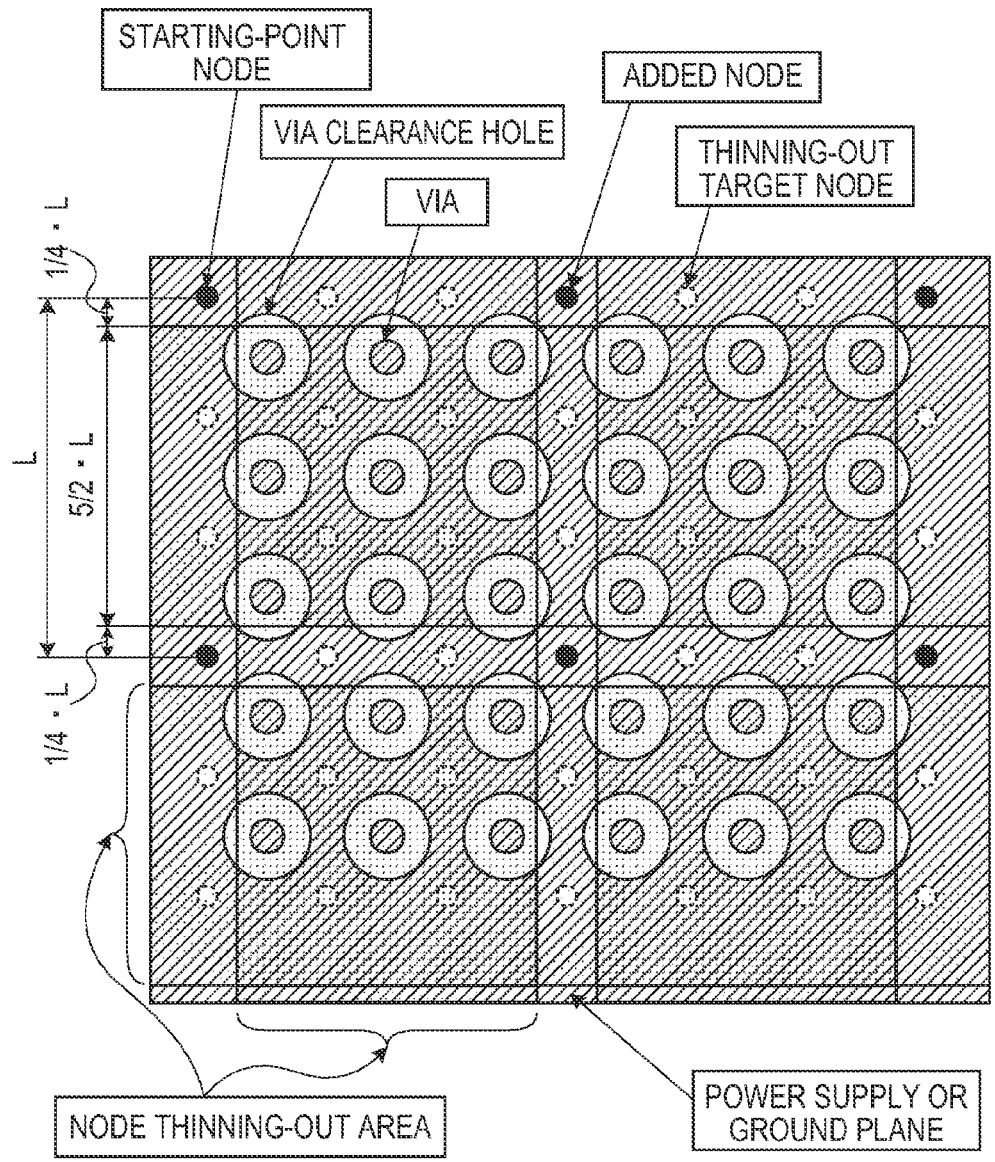
FIG. 8 is a plane view for illustrating processing for arranging nodes at every three positions in the power supply noise analysis model creation method according to the embodiment.

By the computer performing the processing in FIG. 14, an additional node candidate is targeted by thinning out and the deletion flag is set as True if the additional node candidate belongs to the node thinning-out area shown in FIG. 8. In the processing for actually generating nodes, which is to be described below, the node is treated as a node which is not actually generated. The additional node candidate targeted by thinning out is indicated by a broken-line white circle as a "thinning-out target node" in FIG. 8.

Figure 15:
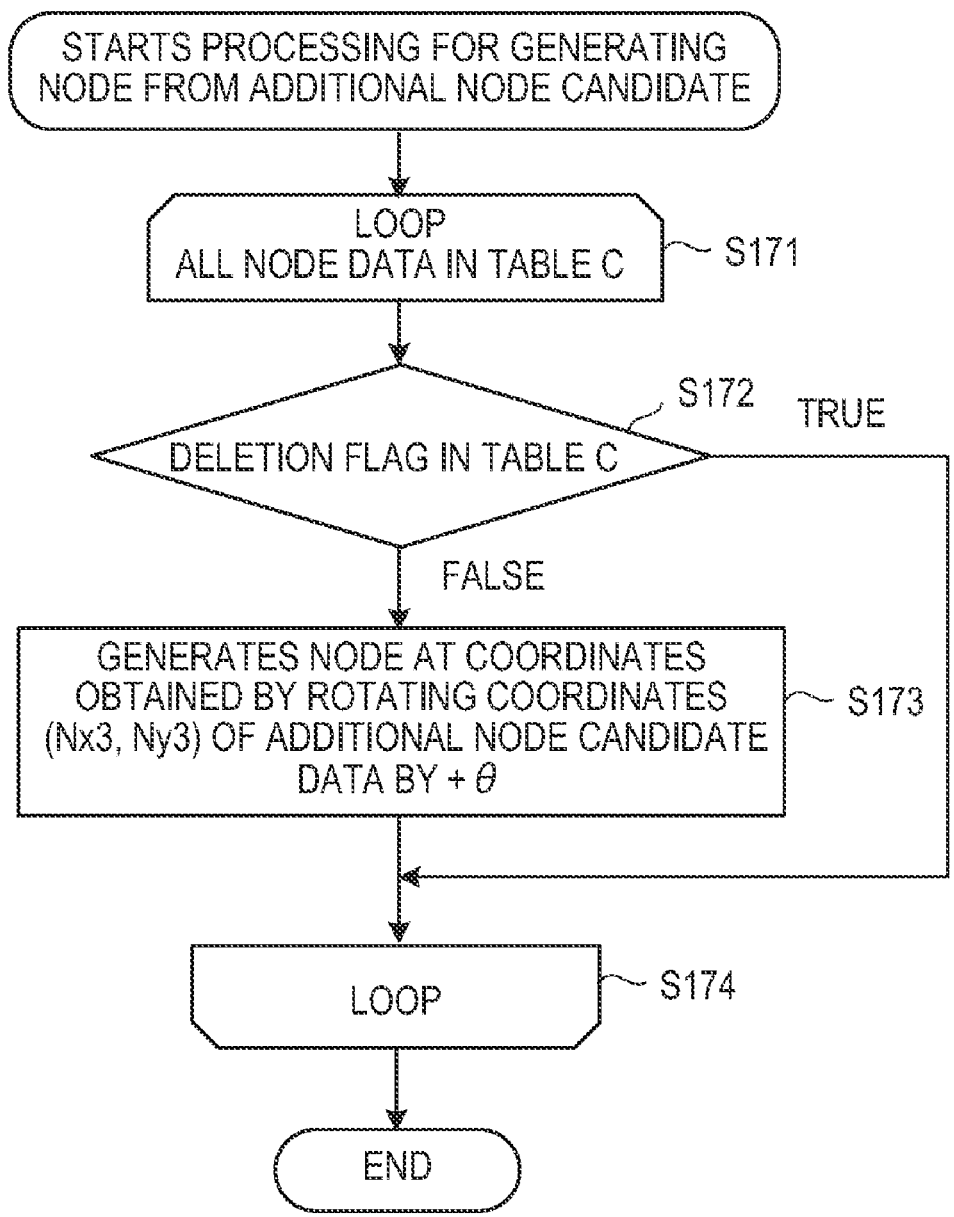
FIG. 15 is a flowchart for illustrating the flow of processing for generating a node from the additional node candidate data in the power supply noise analysis model creation method according to the embodiment.

Returning to FIG. 9, at step S27, the computer actually generates nodes for additional node candidates left as a result of creation at step S24 and reduction performed at S26 as necessary. FIG. 15 is a flowchart for illustrating the processing by the computer at step S27 in detail.

In FIG. 15, at step S172, the computer actually generates nodes at positions of additional node candidates with the deletion flag set as False (step S172: False), among the additional node candidates stored into the table C (step S173). The coordinates at which the computer generates the nodes are assumed to be coordinates obtained by rotating the coordinates (Nx3, Ny3) stored in the table C by +θ with the CAD origin as the center. The computer executes steps S172 and S173 for all the nodes in the table C (step S171 and step S174).

Returning to FIG. 4, the computer next performs mesh division processing at step S6.

First, the computer performs mesh division processing of the power island structure. (1-1) First, the computer references one of the nodes generated in the power island structure at steps S4 and S5 described above. (1-2) Then, the computer searches for neighbor nodes surrounding the node referenced. (1-3) The computer draws a perpendicular bisectors between the referenced node and the neighbor nodes and obtains the figure surrounded by the perpendicular bisectors as a mesh for the referenced node. In this case, the lines connecting the referenced node and the neighbor nodes are the node links. (1-4) The computer performs the above processings (1-1), (1-2) and (1-3) for all the nodes within the power island structure.

Next, the computer performs mesh division processing of the power supply pair. (2-1) The computer selects one of the nodes generated for the power supply pair and sets the selected node as a referenced node. (2-2) Neighbor nodes surrounding the node to which attention is paid are searched for. (2-3) The computer draws a perpendicular bisectors between the node referenced and the neighbor nodes and obtains the figure surrounded by the perpendicular bisectors as a mesh for the node referenced. (2-4) The computer performs the above processings (2-1), (2-2) and (2-3) for all the nodes within the power supply pair.

Next, the computer performs LR parameter calculation processing (step S7 in FIG. 4). (3-1) The computer references one of the node links created by the above processing (1-3). (3-2) From the distance between the nodes at the ends of the node link referenced (the same as the length of the node link), the mesh width and the conductor thickness, the computer determines an R (resistance) value between the nodes. (3-3) From the distance between the nodes at the ends of the node link (the same as the length of the node link), the mesh width and the distance between the layers, the computer determines an L (inductance) value between the nodes. (3-4) The computer repeats the above processings (3-1) to (3-3) for all the node links.

Next, the computer performs C parameter calculation processing (step S8 in FIG. 4). (4-1) The computer references one of the meshes of the power supply pair created by the above processing (2-3). (4-2) From the area of the mesh referenced and the distance between the layers, the computer determines a C (capacitance) value between the nodes. (4-3) The computer repeats the above processings (4-1) and (4-2) for all the meshes of the power supply pair.

Next, the computer performs power supply mesh model (that is, the above power supply noise analysis model) generation processing (step S9 in FIG. 4). (5-1) The computer creates a model in which the nodes of the power island structures are connected with each other with the resistance determined by the above processing (3-2) and the inductance determined by the above processing (3-3). (5-2) To the above model, the computer adds a model in which the nodes in different layers of the power supply pair are connected with each other with the capacitance determined by the above processing (4-2). (5-3) The computer further adds a via model.

By the above processings by the computer, the data of the power supply noise analysis model can be obtained.

In the power supply noise analysis model creation method according to the embodiment, it is desirable that the computer which executes the power supply noise analysis model creation method has the following functions. That is, it is desirable to provide a function of displaying the state of the nodes added at step S5 in FIG. 4 and the meshes obtained by division into meshes at step S6, as shown in FIG. 3A or FIG. 3B, on the screen of the computer.

The configuration of the computer in the case of causing the computer to automatically execute the above-described power supply noise analysis model creation method of the embodiment will be described below with reference to FIGS. 16 and 17.

FIG. 16 is a perspective view showing the above computer.

A computer 100 shown in FIG. 16 has a body section 101 in which a CPU, a disk drive and the like (not shown) are included, and a display 102 which displays an image on a display screen 102a in response to an instruction from the body section 101. The computer 100 also has a keyboard 103 for inputting various information to the computer 100, and a mouse 104 for specifying any position on the display screen 102a of the display 102. The computer 100 also has a modem 105 for accessing an external database or the like to download a computer program or the like stored in a different computer.

The power supply noise analysis model creation program for causing a computer to execute the power supply noise analysis model creation method is stored in a portable recording medium such as a disk 110 or downloaded from a recording medium 106 of a different computer with the use of a communication device such as the modem 105. The program is inputted to the computer 100 and compiled.

FIG. 17 is a diagram illustrating the configuration of main parts in the body section 101 of the computer 100. In the figure, the body section 101 has a CPU 201, a memory section 202 configured by a RAM, a ROM and the like, a disk drive 203 for the disk 110, and a hard disk drive (HDD) 204 which are connected via a bus 200 schematically shown. The display 102, the keyboard 103, the image-pickup section 120 and the mouse 104 are also connected to the CPU 201 via the bus 200 as shown in the figure. However, they may be connected directly to the CPU 201. The display 102 may be connected to the CPU 201 via a well-known graphic interface (not shown) for processing of input/output image data.

The configuration of the computer 100 is not limited to the configuration shown in FIGS. 16 and 17, and various well-known configurations may be used instead.

In the computer 100 configured as described above, the power supply noise analysis model creation program compiled by the computer 100 as described above is executed by the CPU 201. As a result, the power supply noise analysis model creation method of the embodiment which has been described above with reference to FIGS. 1 to 15, is automatically executed.

Next, a result of actually applying the power supply noise analysis model creation method of the embodiment to CAD data of a multi-layer circuit board will be described with reference to FIGS. 18A, 18B and 18C.

Various applied conditions in the application example are as follows:

Evaluation target: PCB size: 200 mm×50 mm

Analysis target LSI: BGA780 pin

Pin pitch (drawing via pitch): 1000 μm

Execution machine: Intel Core2Duo 6700

Contents of analysis: frequency analysis has been performed. More specifically, a sine wave current source of 1 A is connected between V and G of LSI as a noise source, and analysis is performed by sweeping frequency from 1 MHz to 1 GHz.

Division into meshes: the whole circuit board is divided with a pitch of 25 mm.

As for the comparison target "250 μm pitch" (see FIG. 18A), only the area expanded by 5 mm from the rectangle surrounding the LSI pins toward the outside is divided with a pitch of 250 μm.

The effect of reduction in the model size and the analysis time is as shown in FIG. 18A.

In comparison with the case where the pitch is reduced (250 μm pitch), both of the number of analysis model elements and the analysis time are reduced by one digit or more in addition of nodes around LSI drawing vias (the method of the embodiment) and addition of nodes around vias at every three positions (the method of the embodiment). Thus, it is apparent that the embodiment has an effect on improvement of the analysis speed.

FIG. 18B shows comparison among results (impedance values) of analysis at various frequencies (in each field, the value in parentheses at the lower position indicates the rate of error when a 250 μm-pitch mesh is used as a reference).

It is seen that, in comparison with the case where the pitch is reduced (250 μm pitch), the error is larger in the order of addition of nodes around LSI drawing vias (the method of the embodiment), addition of nodes around vias at every three positions (the method of the embodiment), and no addition of nodes. The difference within 5% is considered to be within the error range of a circuit simulator. In comparison with the case of no addition of nodes, the result of two-fold higher accuracy is obtained at a high-frequency area in the method of the embodiment.

Figure 18C:
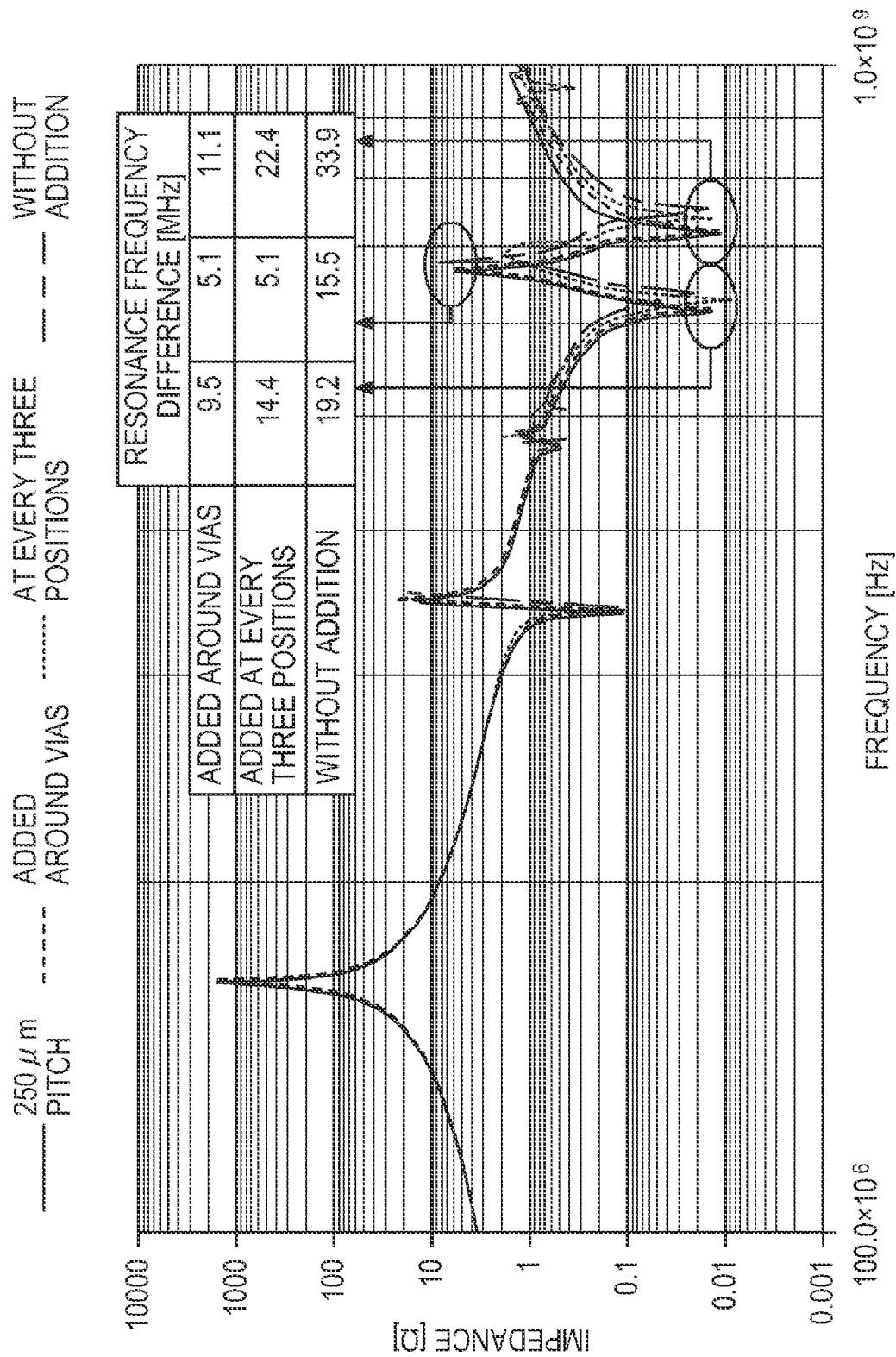
FIG. 18C is a diagram (3) for illustrating an example of application of the embodiment.

FIG. 18C shows resonance frequency difference in comparison with the 250 μm pitch.

It is seen that, in comparison with the case where the pitch is reduced (250 μm pitch), the error is larger in the order of addition of nodes around LSI drawing vias (the method of the embodiment), addition of nodes around vias at every three positions (the method of the embodiment), and no addition of nodes.

The claims below are further disclosed with regard to the above embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A power supply noise analysis model creation method, comprising the steps of:
reading data indicating the shapes of power supply conductors or grounding conductors of a multi-layer circuit board from a memory, and generating the data of a power island structure indicating the power supply conductors or grounding conductors provided on the circuit board on the basis of the data;
reading data indicating the shapes of power supply conductors or grounding conductors provided on different layers of the multi-layer circuit board from the memory, and generating the data of a power supply pair indicating a shape where the power supply conductors or the grounding conductors provided on the different layers of the multi-layer circuit board face with each other on the basis of the data;
reading the data of the positions of connection pads of a semiconductor device mounted on the circuit board from the memory, and determining a processing target area including the positions of the connection pads of the semiconductor device on the basis of the data, reading the data of the positions of vias included in the processing target area from the memory, and storing the data of the positions of the vias into the memory;
reading the data of the positions of the vias from the memory, calculating the distances among the vias on the basis of the data, and judging, for each of the vias, the nearest via;
obtaining a distance which appears most frequently, from among the distances from the vias judged to be the nearest to the vias, respectively, as a reference via pitch;
obtaining each of the positions of the vias from the data stored in the memory, as a processing target via, and generating four nodes for the processing target via in a manner that the position relation between the processing target via and the four nodes corresponds to the position relation between one via and four nodes in the case where, when vias are two-dimensionally arrayed with the reference via pitch, a total of the four nodes are generated for the one via, each of the four nodes being generated at almost the middle point of each of line segments connecting the one via and adjacent four vias in directions oblique to the direction of the reference via pitch;
obtaining meshes which include the nodes, respectively, by dividing the power island structure by dividing lines which pass between the generated nodes;
obtaining meshes which include the nodes, respectively, by dividing the power supply pair by dividing lines which pass between the generated nodes; and
converting each of the meshes obtained in each of the power island structure mesh dividing step and power supply pair mesh dividing step to a circuit element equivalent to the mesh and generating an analysis model for analyzing power supply noise caused on the circuit board.

2. The power supply noise analysis model creation method according to claim 1, further comprising the steps of:
calculating the distances among the vias on the basis of the data of the positions of the vias read from the memory, and, if the distance between a via and the nearest via corresponds to the reference via pitch, obtaining an angle which is the remainder obtained by dividing the angle of a line segment connecting the via and the nearest via relative to a reference direction by 90°;
obtaining an angle which appears most frequently, from among the remainder angles obtained in the angle-between-vias obtaining step, as a reference via angle;
reading the data of the positions of the vias from the memory, and obtaining, for each of the vias, the data of the position of the via rotated in the opposite direction by an angle corresponding to the reference via angle with the origin as the center and storing the data into the memory;
when generating nodes, obtaining, for the data of the positions of the vias which have been rotated, each of the vias the position data of which is stored in the memory, as a processing target via, and generating four nodes for the processing target via in a manner that the position relation between the processing target via and the four nodes corresponds to the position relation between one via and four nodes in the case where, when vias are two-dimensionally arrayed with the reference via pitch, a total of the four nodes are generated for the one via, each of the four nodes being generated at almost the middle point of each of line segments connecting the one via and adjacent four vias in directions oblique to the direction of the reference via pitch; and
further obtaining the positions obtained by rotating the generation positions of the generated nodes in the positive direction by an angle corresponding to the reference via angle with the origin as the center, as the final positions of the generated nodes; wherein in an acquisition of the meshes for the power island structure, the meshes which include the nodes, respectively, are obtained by dividing the power island structure by dividing lines which pass between the generated nodes, on the basis of the final positions of the generated nodes; and in an acquisition of the meshes for the power supply pair, the meshes which include the nodes, respectively, are obtained by dividing the power supply pair by dividing lines which pass between the generated nodes, on the basis of the final positions of the generated nodes.

3. The power supply noise analysis model creation method according to claim 1, further comprising the step of:

deleting, for each predetermined number of nodes in each of vertical and horizontal directions on the two-dimensional array of the obtained nodes, nodes between and excluding the first and last nodes; wherein in an acquisition of the meshes for the power island structure, the meshes which include the nodes, respectively, are obtained by, on the basis of the nodes other than the deleted nodes, among the generated nodes, dividing the power island structure by dividing lines which pass between the nodes; and in an acquisition of the meshes for the power supply pair, the meshes which include the nodes, respectively, are obtained by, on the basis of the nodes other than the deleted nodes, among the generated nodes, dividing the power supply pair by dividing lines which pass between the nodes.

4. The power supply noise analysis model creation method according to claim 1, further comprising the step of:

reading a position where at least one of the vias and the connection pads of the semiconductor is connected, on the power supply conductor or the grounding conductor of the circuit board, from the memory, and generating a node at the position; wherein when the four nodes are generated for the processing target via, such a node that the distance from a node which has already been generated in the node generating step is equal to or shorter than a predetermined distance, among the four nodes to be generated, is not generated in the end.

5. A power supply noise analysis model creation apparatus comprising:

power island structure data generating means for reading data indicating the shapes of power supply conductors or grounding conductors of a multi-layer circuit board from a memory, and generating the data of a power island structure indicating the power supply conductors or grounding conductors provided on the circuit board on the basis of the data;

power supply pair data generating means for reading data indicating the shapes of power supply conductors or grounding conductors provided on different layers of the multi-layer circuit board from the memory, and generating the data of a power supply pair indicating a shape where the power supply conductors or the grounding conductors provided on the different layers of the multi-layer circuit board face with each other on the basis of the data;

area determining means for reading the data of the positions of connection pads of a semiconductor device mounted on the circuit board from the memory, and determining a processing target area including the positions of the connection pads of the semiconductor device on the basis of the data, via position data storing means for reading the data of the positions of vias included in the processing target area from the memory, and storing the data of the positions of the vias into the memory;

nearest via judging means for reading the data of the positions of the vias from the memory, calculating the distances among the vias on the basis of the data, and judging, for each of the vias, the nearest via;

reference via pitch obtaining means for obtaining a distance which appears most frequently, from among the distances from the vias judged to be the nearest to the vias, respectively, as a reference via pitch;

node generating means for obtaining each of the positions of the vias from the data stored in the memory, as a processing target via, and generating four nodes for the processing target via in a manner that the position relation between the processing target via and the four nodes corresponds to the position relation between one via and four nodes in the case where, when vias are two-dimensionally arrayed with the reference via pitch, a total of the four nodes are generated for the one via, each of the four nodes being generated at almost the middle point of each of line segments connecting the one via and adjacent four vias in directions oblique to the direction of the reference via pitch;

power island structure mesh dividing means for obtaining meshes which include the nodes, respectively, by dividing the power island structure by dividing lines which pass between the generated nodes;

power supply pair mesh dividing means for obtaining meshes which include the nodes, respectively, by dividing the power supply pair by dividing lines which pass between the generated nodes; and analysis model creating means for converting each of the meshes obtained by each of power island structure mesh dividing means and power supply pair mesh dividing means to a circuit element equivalent to the mesh and generating an analysis model for analyzing power supply noise caused on the circuit board.

6. The power supply noise analysis model creation apparatus according to claim 5, further comprising:

angle-between-vias obtaining means for, further reading the data of the positions of the vias from the memory, calculating the distances among the vias on the basis of the data, judging, for each of the vias, the nearest via, and, if the distance between a via and the nearest via corresponds to the reference via pitch, obtaining an angle which is the remainder obtained by dividing the angle of a line segment connecting the via and the nearest via relative to a reference direction by 90°;

reference via angle obtaining means for obtaining an angle which appears most frequently, from among the remainder angles obtained by the angle-between-vias obtaining means, as a reference via angle; and first rotating means for reading the data of the positions of the vias from the memory, and obtaining, for each of the vias, the data of the position of the via rotated in the opposite direction by an angle corresponding to the reference via angle with the origin as the center and storing the data into the memory; wherein for the data of the positions of the vias which have been rotated by the first rotating means, the node generating means obtains each of the vias the position data of which is stored in the memory, as a processing target via, and generates four nodes for the processing target via in a manner that the position relation between the processing target via and the four nodes corresponds to the position relation between one via and four nodes in the case where, when vias are two-dimensionally arrayed with the reference via pitch, a total of the four nodes are generated for the one via, each of the four nodes being generated at almost the middle point of each of line segments connecting the one via and adjacent four vias in directions oblique to the direction of the reference via pitch; and the power supply noise analysis model creation apparatus further comprises second rotating means for further obtaining the positions obtained by rotating the generation positions of the generated nodes in the positive direction by an angle corresponding to the reference via angle with the origin as the center, as the final positions of the generated nodes; wherein the power island structure mesh dividing means obtains the meshes which include the nodes, respectively, by dividing the power island structure by dividing lines which pass between the generated nodes, on the basis of the final positions of the generated nodes; and the power supply pair mesh dividing means obtains the meshes which include the nodes, respectively, by dividing the power supply pair by dividing lines which pass between the generated nodes, on the basis of the final positions of the generated nodes.

7. The power supply noise analysis model creation apparatus according to claim 5, further comprising:

node thinning-out means for deleting, for each predetermined number of nodes in each of vertical and horizontal directions on the two-dimensional array of the nodes obtained by the node generating means, nodes between and excluding the first and last nodes; wherein the power island structure mesh dividing means obtains the meshes which include the nodes, respectively, by, on the basis of the nodes other than the nodes deleted by the node thinning-out means, among the nodes generated by the node generating means, dividing the power island structure by dividing lines which pass between the nodes; and the power supply pair mesh dividing means obtains the meshes which include the nodes, respectively, by, on the basis of the nodes other than the nodes deleted by the node thinning-out means, among the nodes generated by the node generating means, dividing the power supply pair by dividing lines which pass between the nodes.

8. The power supply noise analysis model creation apparatus according to claim 5, wherein the node generating means further reads a position where at least one of the vias and the connection pads of the semiconductor is connected, on the power supply conductor or the grounding conductor of the circuit board, from the memory, and generates a node at the position; and when the node generating means generates the four nodes for the processing target via, such a node that the distance from a node which has already been generated by the node generating means is equal to or shorter than a predetermined distance, among the four nodes to be generated, is not generated in the end.

9. A non-transitory recording medium in which a program for causing a computer to execute power supply noise analysis model creation processing, the program causing the computer to execute the steps of:

reading data indicating the shapes of power supply conductors or grounding conductors of a multi-layer circuit board from a memory, and generating the data of a power island structure indicating the power supply conductors or grounding conductors provided on the circuit board on the basis of the data;

reading data indicating the shapes of power supply conductors or grounding conductors provided on different layers of the multi-layer circuit board from the memory, and generating the data of a power supply pair indicating a shape where the power supply conductors or the grounding conductors provided on the different layers of the multi-layer circuit board face with each other on the basis of the data;

reading the data of the positions of the connection pads of a semiconductor device mounted on the circuit board from the memory, and determining a processing target area including the positions of the connection pads of the semiconductor device on the basis of the data, reading the data of the positions of vias included in the processing target area from the memory, and storing the data of the positions of the vias into the memory;

reading the data of the positions of the vias from the memory, calculating the distances among the vias on the basis of the data, and judging, for each of the vias, the nearest via;

obtaining a distance which appears most frequently, from among the distances from the vias judged to be the nearest to the vias, respectively, as a reference via pitch;

obtaining each of the positions of the vias from the data stored in the memory, as a processing target via, and generating four nodes for the processing target via in a manner that the position relation between the processing target via and the four nodes corresponds to the position relation between one via and four nodes in the case where, when vias are two-dimensionally arrayed with the reference via pitch, a total of the four nodes are generated for the one via, each of the four nodes being generated at almost the middle point of each of line segments connecting the one via and adjacent four vias in directions oblique to the direction of the reference via pitch;

obtaining meshes which include the nodes, respectively, by dividing the power island structure by dividing lines which pass between the generated nodes;

obtaining meshes which include the nodes, respectively, by dividing the power supply pair by dividing lines which pass between the generated nodes; and converting each of the meshes obtained by each of power island structure mesh dividing means and power supply pair mesh dividing means to a circuit element equivalent to the mesh and generating an analysis model for analyzing power supply noise caused on the circuit board.

* * * * *